(12) United States Patent
Kim et al.

(10) Patent No.: US 9,299,811 B2
(45) Date of Patent: Mar. 29, 2016

(54) METHODS OF FABRICATING SEMICONDUCTOR DEVICES

(71) Applicant: Samsung Electronics Co., Ltd., Suwon-si, Gyeonggi-do (KR)

(72) Inventors: Wook-Je Kim, Gwacheon-si (KR); Jae-Yup Chung, Yongin-si (KR); Jong-Seo Hong, Yongin-si (KR); Cheol Kim, Hwaseong-si (KR); Hee-Soo Kang, Seoul (KR); Hyun-Jo Kim, Seoul (KR); Hee-Don Jeong, Hwaseong-si (KR); Soo-Hun Hong, Gunpo-si (KR); Sang-Bom Kang, Seoul (KR); Myeong-Cheol Kim, Suwon-si (KR); Young-Su Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 29 days.

(21) Appl. No.: 14/519,771

(22) Filed: Oct. 21, 2014

(65) Prior Publication Data

US 2015/0147860 A1    May 28, 2015

(30) Foreign Application Priority Data

Nov. 27, 2013    (KR) .................. 10-2013-0145486

(51) Int. Cl.
   *H01L 29/66*    (2006.01)
   *H01L 21/8234*  (2006.01)
   *H01L 29/78*    (2006.01)
   *H01L 29/165*   (2006.01)

(52) U.S. Cl.
   CPC .. *H01L 29/66795* (2013.01); *H01L 21/823431* (2013.01); *H01L 21/823481* (2013.01); *H01L 29/66545* (2013.01); *H01L 29/165* (2013.01); *H01L 29/7848* (2013.01)

(58) Field of Classification Search
   CPC .................. H01L 27/0886; H01L 21/823431; H01L 21/823481
   See application file for complete search history.

(56) References Cited

U.S. PATENT DOCUMENTS

| | | | |
|---|---|---|---|
| 6,878,985 B2 * | 4/2005 | Arai | .................. H01L 27/11521 257/315 |
| 7,528,033 B2 | 5/2009 | Kim | |
| 7,563,637 B2 | 7/2009 | Kim | |
| 7,786,518 B2 | 8/2010 | Chakravarthi et al. | |
| 7,906,809 B2 | 3/2011 | Aiso | |
| 7,915,693 B2 | 3/2011 | Okano | |
| 7,923,337 B2 | 4/2011 | Chang et al. | |
| 8,264,021 B2 | 9/2012 | Lai et al. | |
| 8,298,913 B2 * | 10/2012 | Anderson | ......... H01L 21/28123 257/E21.159 |

(Continued)

FOREIGN PATENT DOCUMENTS

| | | |
|---|---|---|
| KR | 10-2007-0000758 A | 1/2007 |
| KR | 10-2007-0016369 A | 2/2007 |
| KR | 10-2009-0041869 A | 4/2009 |

*Primary Examiner* — Fernando L Toledo
*Assistant Examiner* — Christine L Hagan
(74) *Attorney, Agent, or Firm* — Myers Bigel & Sibley, P.A.

(57) ABSTRACT

Semiconductor devices may include first and second fins that protrude from a substrate, extend in a first direction, and are separated from each other in the first direction. Semiconductor devices may also include a field insulating layer that is disposed between the first and second fins to extend in a second direction intersecting the first direction, an etch-stop layer pattern that is formed on the field insulating layer and a dummy gate structure that is formed on the etch-stop layer pattern.

12 Claims, 32 Drawing Sheets

(56) References Cited

U.S. PATENT DOCUMENTS

| | | | |
|---|---|---|---|
| 8,350,253 B1 | 1/2013 | Zhu et al. | |
| 8,836,046 B2 * | 9/2014 | Maeda | H01L 29/41791 257/368 |
| 8,878,260 B2 * | 11/2014 | Anderson | H01L 21/28123 257/288 |
| 8,878,309 B1 * | 11/2014 | Hong | H01L 27/0886 257/330 |
| 8,916,460 B1 * | 12/2014 | Kwon | H01L 29/66795 257/192 |
| 8,969,974 B2 * | 3/2015 | Liaw | H01L 21/823821 257/401 |
| 9,190,407 B2 * | 11/2015 | Kwon | H01L 29/66795 |
| 9,209,179 B2 * | 12/2015 | Lee | H01L 27/0886 |
| 2007/0114612 A1 * | 5/2007 | Ahn | H01L 27/11 257/364 |
| 2009/0242995 A1 | 10/2009 | Suzuki et al. | |
| 2009/0315116 A1 | 12/2009 | Sakuma | |
| 2011/0024846 A1 | 2/2011 | Kammler et al. | |
| 2011/0068407 A1 | 3/2011 | Yeh et al. | |
| 2012/0025315 A1 | 2/2012 | Kronholz et al. | |
| 2012/0138886 A1 | 6/2012 | Kuhn et al. | |
| 2012/0273850 A1 | 11/2012 | Chun | |
| 2013/0187237 A1 | 7/2013 | Yu et al. | |
| 2014/0346602 A1 * | 11/2014 | Maeda | H01L 29/41791 257/347 |
| 2014/0353763 A1 * | 12/2014 | Chung | H01L 21/823431 257/390 |
| 2014/0353769 A1 * | 12/2014 | Maeda | H01L 29/41791 257/401 |
| 2015/0054089 A1 * | 2/2015 | Hong | H01L 27/0886 257/401 |
| 2015/0162339 A1 * | 6/2015 | Divakaruni | H01L 27/11521 257/321 |

* cited by examiner

METHODS OF FABRICATING SEMICONDUCTOR DEVICES

This application claims priority from Korean Patent Application No. 10-2013-0145486 filed on Nov. 27, 2013 in the Korean Intellectual Property Office, the disclosure of which is incorporated herein by reference in its entirety.

FIELD

The present inventive concept relates to semiconductor devices and methods of fabricating the same.

BACKGROUND

Scaling techniques for increasing the density of semiconductor devices may include multi-gate transistors, which are obtained by forming a fin or nanowire-shaped multi-channel active pattern (or silicon body) on a substrate and forming gates on the surface of the multi-channel active pattern. Since multi-gate transistors use three-dimensional (3D) channels, they are easily scaled. However, multi-gate transistors may suffer a short channel effect (SCE) when the drain voltage affects the electric potential in a channel region.

SUMMARY

Embodiments of the present inventive concept provide semiconductor devices having operating characteristics that are improved by preventing a short circuit and epitaxially growing source/drain regions with fewer problems.

Embodiments of the present inventive concept also provide a method of fabricating a semiconductor device that improves operating characteristics by preventing a short circuit and epitaxially growing source/drain regions with fewer problems.

However, embodiments of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to some embodiments of the present inventive concept, a semiconductor device includes first and second fins that protrude from a substrate, extend in a first direction, and are separated from each other in the first direction. The semiconductor device also includes a field insulating layer that is disposed between the first and second fins to extend in a second direction intersecting the first direction, an etch-stop layer pattern that is formed on the field insulating layer and a dummy gate structure that is formed on the etch-stop layer pattern.

According to some embodiments of the present inventive concept, a method of fabricating a semiconductor device includes forming first and second fins that protrude from a substrate and extend in a first direction and form a trench that separates the first and second fins in the first direction. The method also includes forming a field insulating layer on the substrate that fills the trench and covers the first and second fins, etching the field insulating layer until top surfaces of the first and second fins are exposed, forming an etch-stop layer pattern on the field insulating layer that fills the trench and partially exposing sidewalls of the first and second fins by etching the field insulating layer using the etch-stop layer pattern as a mask.

According to some embodiments, a method of fabricating a semiconductor device includes forming a field insulating layer on a substrate such that the field insulating layer covers first and second fins that protrude from the substrate and fills a trench between the first and second fins. The method also includes etching the field insulating layer. The top surfaces of the first and second fins may be exposed. The method further includes forming an etch-stop layer on the field insulating layer that fills the trench. The edges of the etch-stop layer extend past sidewalls of the trench. The method also includes etching the field insulating layer using the etch-stop layer as a mask.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
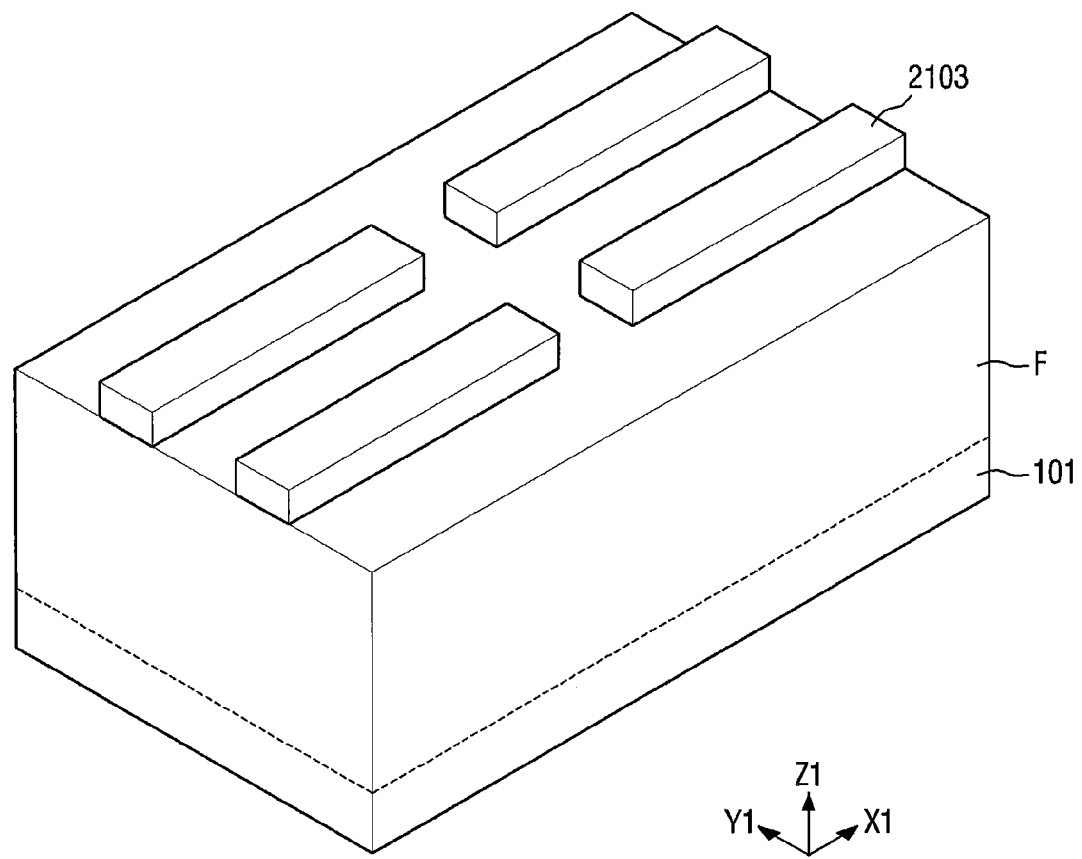
FIGS. 1 through 27 are views illustrating a method of fabricating a semiconductor device according to some embodiments of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The current control capability of multi-gate transistors can be improved without the need to increase the gate length. Moreover, a short channel effect (SCE), which is the phenomenon where the electric potential in a channel region is affected by a drain voltage, can be effectively suppressed. A semiconductor device according to some embodiments of the present inventive concept will now be described with reference to FIGS. 1 through 27.

FIGS. 1 through 27 are views illustrating a method of fabricating a semiconductor device according to some embodiments of the present inventive concept. Specifically, FIG. 3 is a cross-sectional view taken along the line A-A of FIG. 2. FIG. 6 is a cross-sectional view taken along the line A-A of FIG. 5. FIG. 8 is a cross-sectional view taken along the line A-A of FIG. 7. FIG. 10 is a cross-sectional view taken along the line A-A of FIG. 9. FIG. 12 is a cross-sectional view taken along the line A-A of FIG. 11. FIG. 13 is a cross-sectional view taken along the line B-B of FIG. 11. FIG. 16 is a cross-sectional view taken along the line A-A of FIG. 15. FIG. 17 is a cross-sectional view taken along the line A-A of FIG. 15. FIG. 19 is a cross-sectional view taken along the line A-A of FIG. 18. FIG. 21 is a cross-sectional view taken along the line A-A of FIG. 20. FIG. 23 is a cross-sectional view taken along the line A-A of FIG. 22. FIG. 24 is a cross-sectional view taken along the line B-B of FIG. 22. FIG. 26 is a cross-sectional view taken along the line A-A of FIG. 25. FIG. 27 is a cross-sectional view taken along the line B-B of FIG. 25.

First, referring to FIG. 1, an active region F is formed on a substrate 101, and first mask patterns 2103 are formed on the active region F. Specifically, the first mask patterns 2103 are formed on portions of the active region F where first through fourth fins F1 through F4 (see FIG. 2) are to be formed.

The substrate 101 may be formed of one or more semiconductor materials selected from the group consisting of Si, Ge, SiGe, GaP, GaAs, SiC, SiGeC, InAs and InP. In addition, a silicon-on-insulator (SOI) substrate can be used.

The active region F may be integrally formed with the substrate 101 and may include the same material as the substrate 101.

The first mask patterns 2103 may be formed of a material including at least one of a silicon oxide layer, a silicon nitride layer, and a silicon oxynitride layer.

Figure 2:
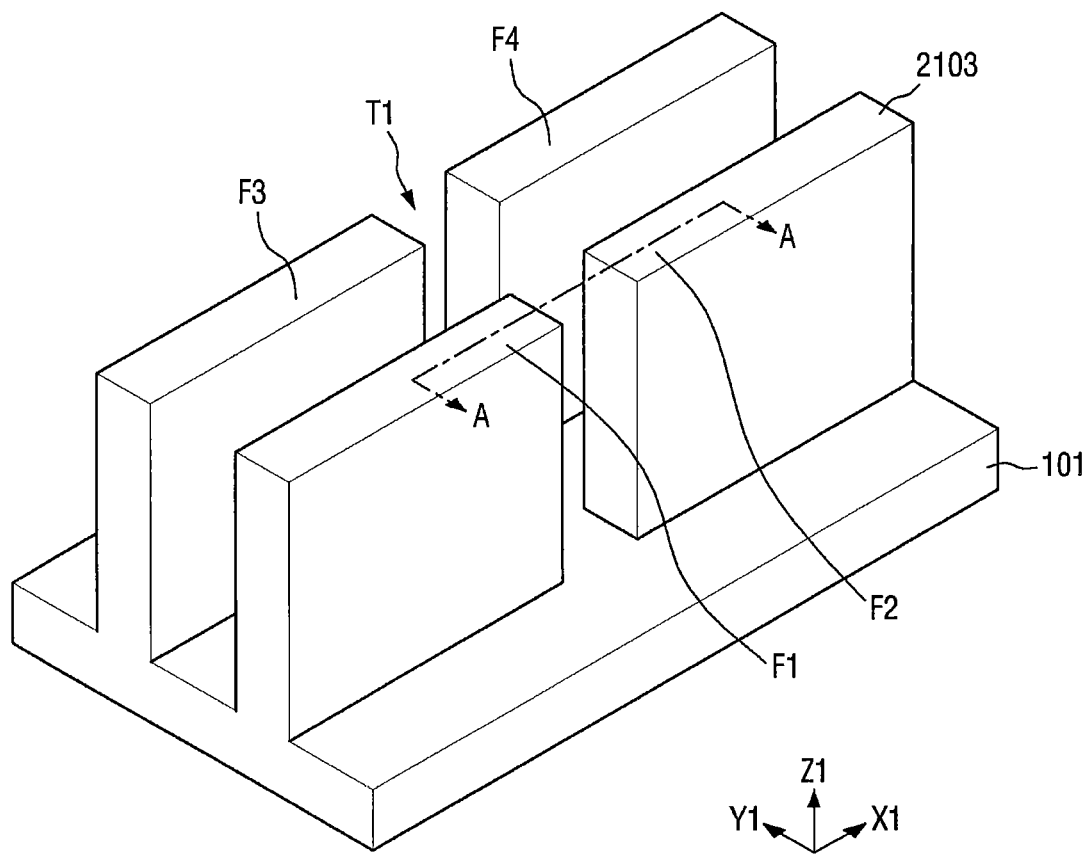
Figure 3:
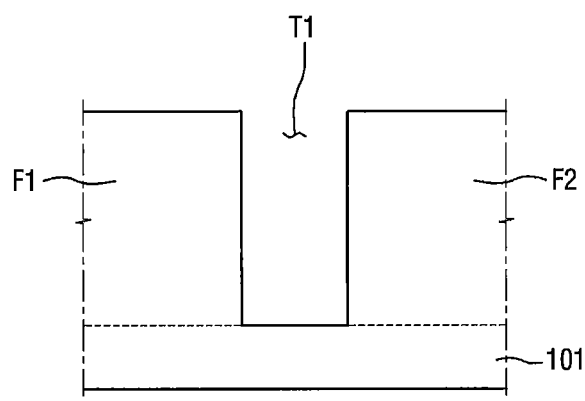

Referring to FIGS. 2 and 3, an etching process is performed using the first mask patterns 2103 as a mask. The etching process results in the formation of the first through fourth fins F1 through F4 and a trench T1.

The first fin F1 and the second fin F2 may be formed on the substrate 101 to protrude in a third direction Z1. In addition, the first fin F1 and the second fin F2 may be arranged and extend in a first direction X1.

The third fin F3 and the fourth F4 are respectively separated from the first fin F1 and the second fin F2 in a second direction Y1 by a predetermined distance. The third fin F3 and the fourth fin F4 may be formed on the substrate 101 to protrude in the third direction Z1. In addition, the third fin F3 and the fourth fin F4 may be arranged and extend in the first direction X1.

The first through fourth fins F1 through F4 may extend along the first direction X1. Specifically, each of the first through fourth fins F1 through F4 may have long sides and short sides. The first through fourth fins F1 through F4 may extend along a long-side direction. In FIG. 2, the long-side direction is the first direction X1, and a short-side direction is the second direction Y1. However, the present inventive concept is not limited thereto. For example, the long-side direction of the first through fourth fins F1 through F4 may be the second direction Y1, and the short-side direction may be the first direction X1.

In the drawings, each of the first through fourth fins F1 through F4 is shaped like a rectangular parallelepiped. However, the present inventive concept is not limited thereto. For example, each of the first through fourth fins F1 through F4 may have a chamfered shape. That is, corners of each of the first through fourth fins F1 through F4 may be rounded. Even if the corners of each of the first through fourth fins F1 through F4 are rounded, it is obvious that the long sides can be distinguished from the short sides by those of ordinary skill in the art.

The trench T1 is formed between the first and second fins F1 and F2 and between the third and fourth fins F3 and F4. The trench T1 separates the first fin F1 and the second fin F2 in the first direction X1 and separates the third fin F3 and the fourth fin F4 in the first direction X1. Both sidewalls of the trench T1 may be a sidewall of the first fin F1 and a sidewall of the second fin F2, respectively, and may be a sidewall of the third fin F3 and a sidewall of the fourth fin F4, respectively.

In the drawings, the trench T1 has a uniform width from bottom to top. However, the present inventive concept is not limited thereto. For example, the width of the trench T1 may gradually increase from bottom to top.

The first mask patterns 2103 are removed after the formation of the trench T1.

Figure 4:
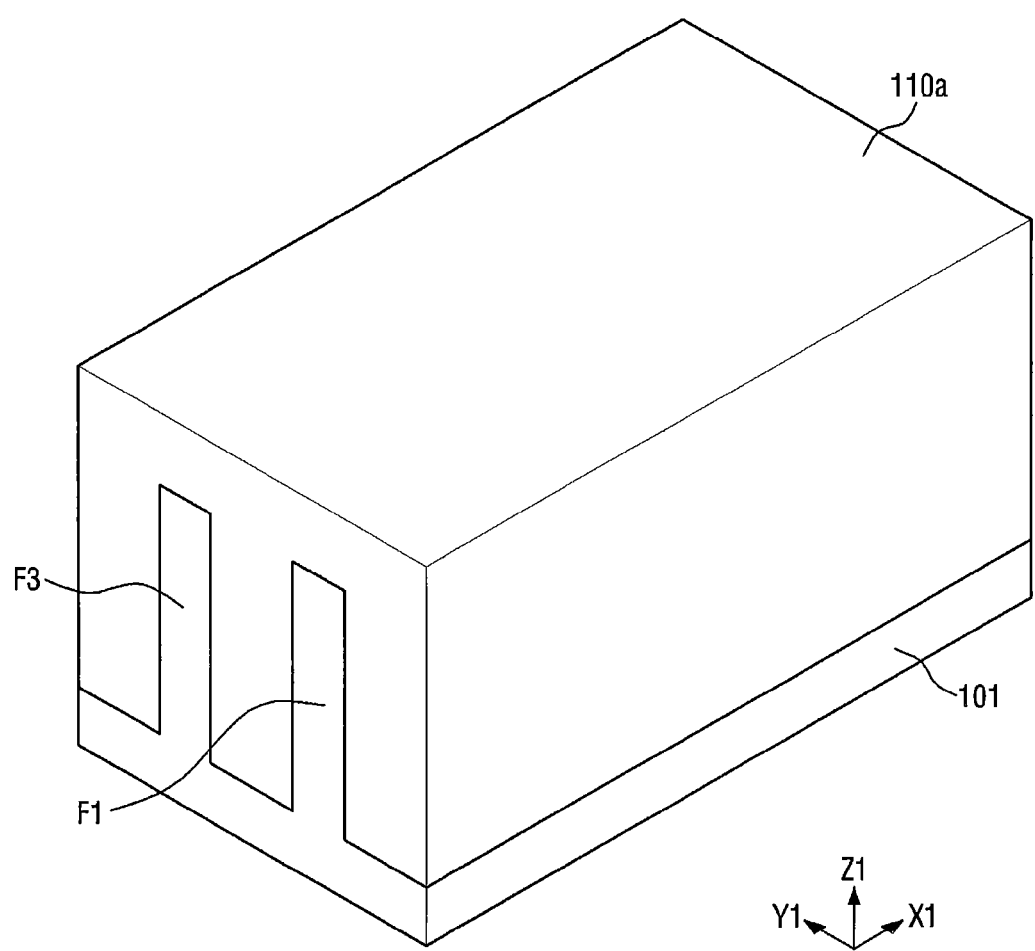

Referring to FIG. 4, a field insulating layer 110a is formed on the substrate 101. The field insulating layer 110a may fill the trench T1 and cover the first through fourth fins F1 through F4. The field insulating layer 110a may be formed of a material including at least one of an oxide layer and an oxynitride layer.

Figure 5:
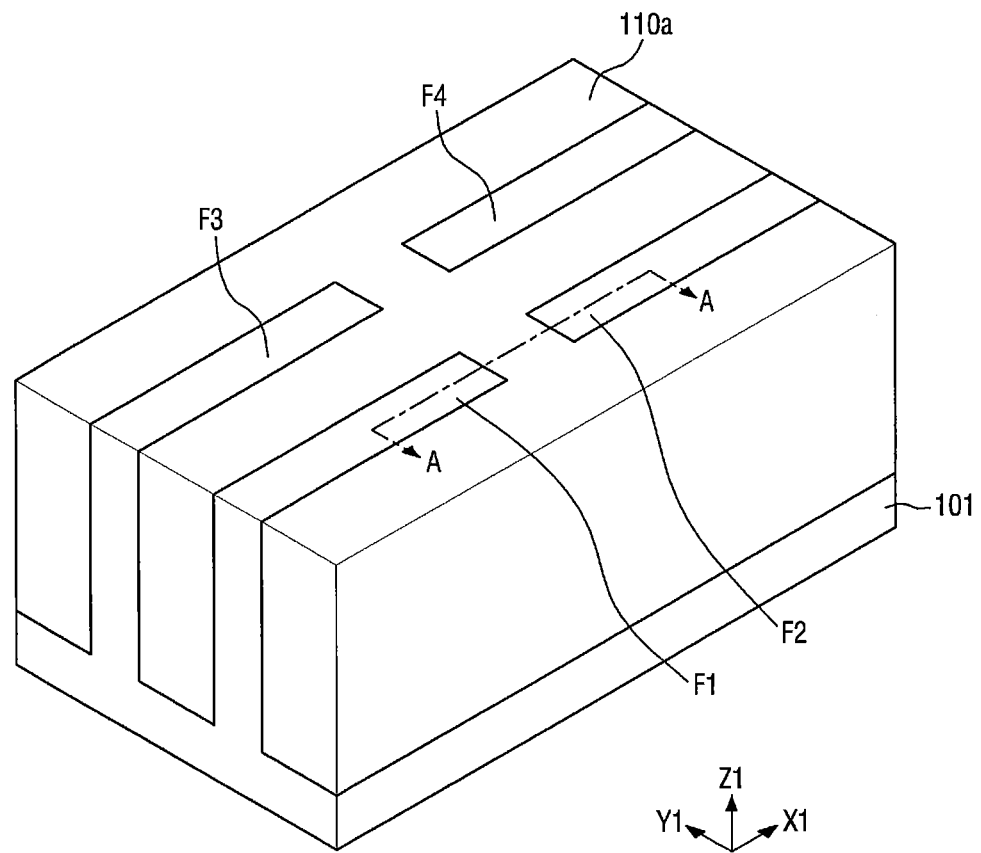
Figure 6:
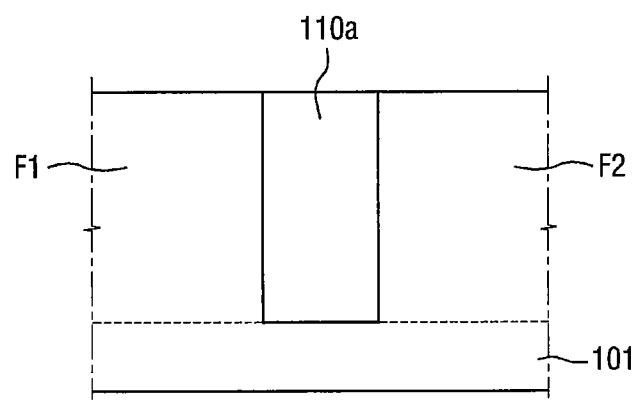

Referring to FIGS. 5 and 6, the field insulating layer 110a is etched to expose top surfaces of the first through fourth fins F1 through F4. Accordingly, a top surface of the field insulating layer 110a may lie in the same plane with the top surfaces of the first through fourth fins F1 through F4. The field insulating layer 110a stills fills the trench T1. The etching of the field insulating layer 110a may be accomplished by, but not limited to, a chemical mechanical polishing (CMP) process.

Figure 7:
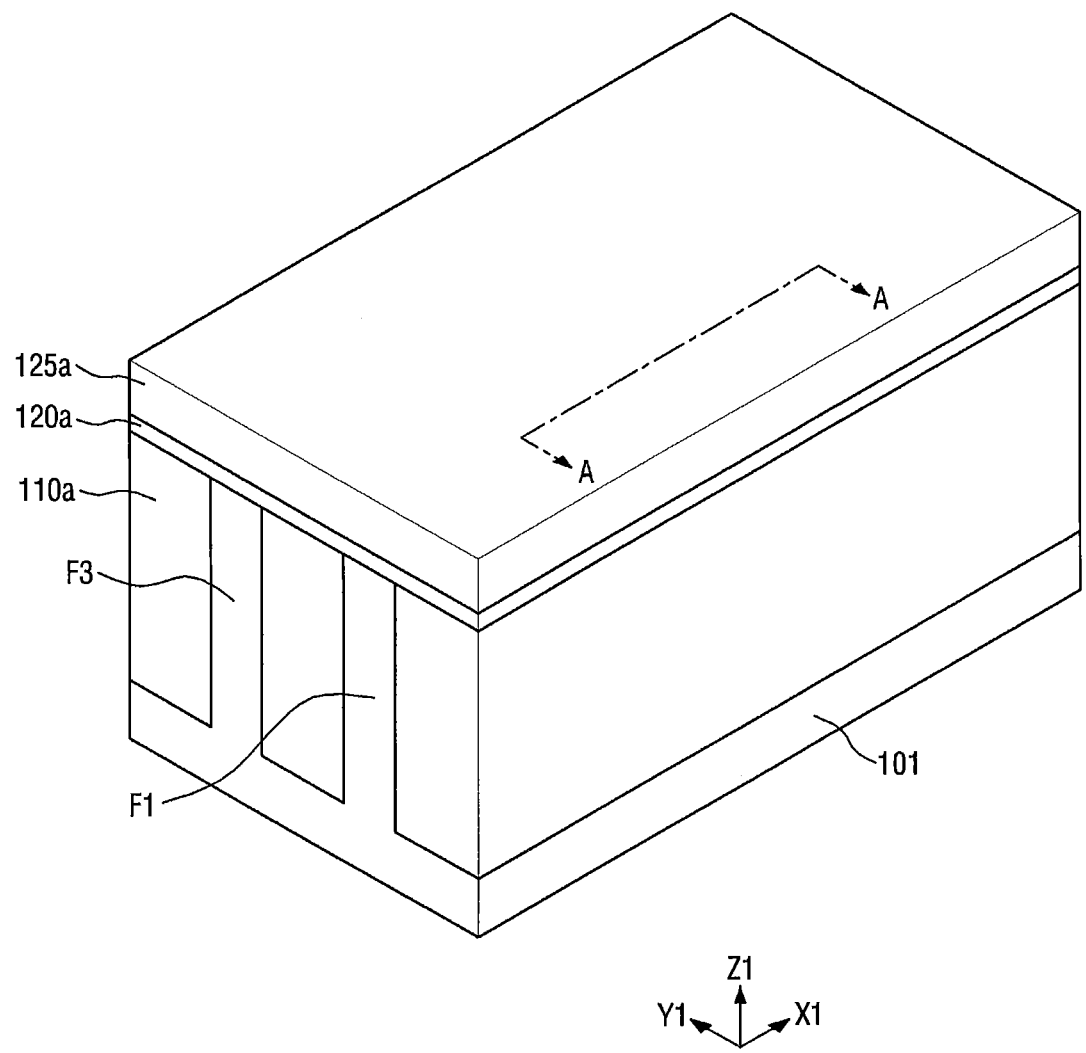
Figure 8:
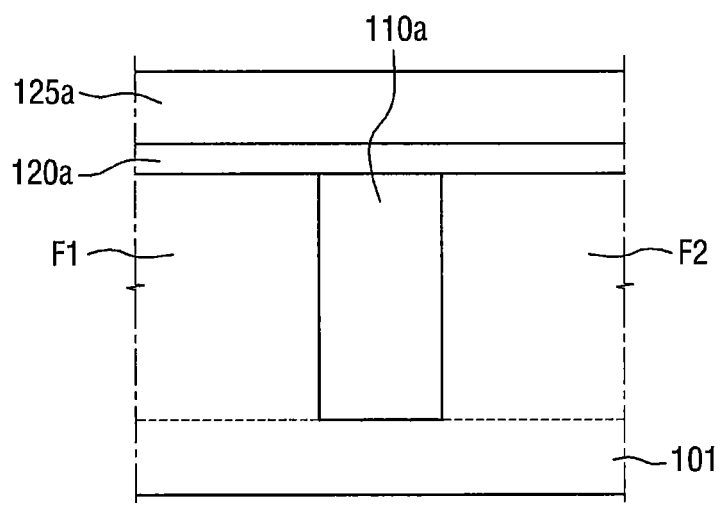

Referring to FIGS. 7 and 8, an etch-stop layer 120a is formed to cover the top surfaces of the first through fourth fins F1 through F4 and the top surface of the field insulating layer 110a. Since the etch-stop layer 120a is formed on the first through fourth fins F1 through F4, a top surface of the etch-stop layer 120a is higher than the top surfaces of the first through fourth fins F1 through F4.

The etch-stop layer 120a may include a different material from the field insulating layer 110a. For example, the etch-stop layer 120a may include a nitride layer.

A hard mask 125a is formed on the etch-stop layer 120a. The hard mask 125a may be, but is not limited to, thicker than the etch-stop layer 120a. The hard mask 125a may be, for example, a spin-on-hard mask (SOH).

Figure 9:
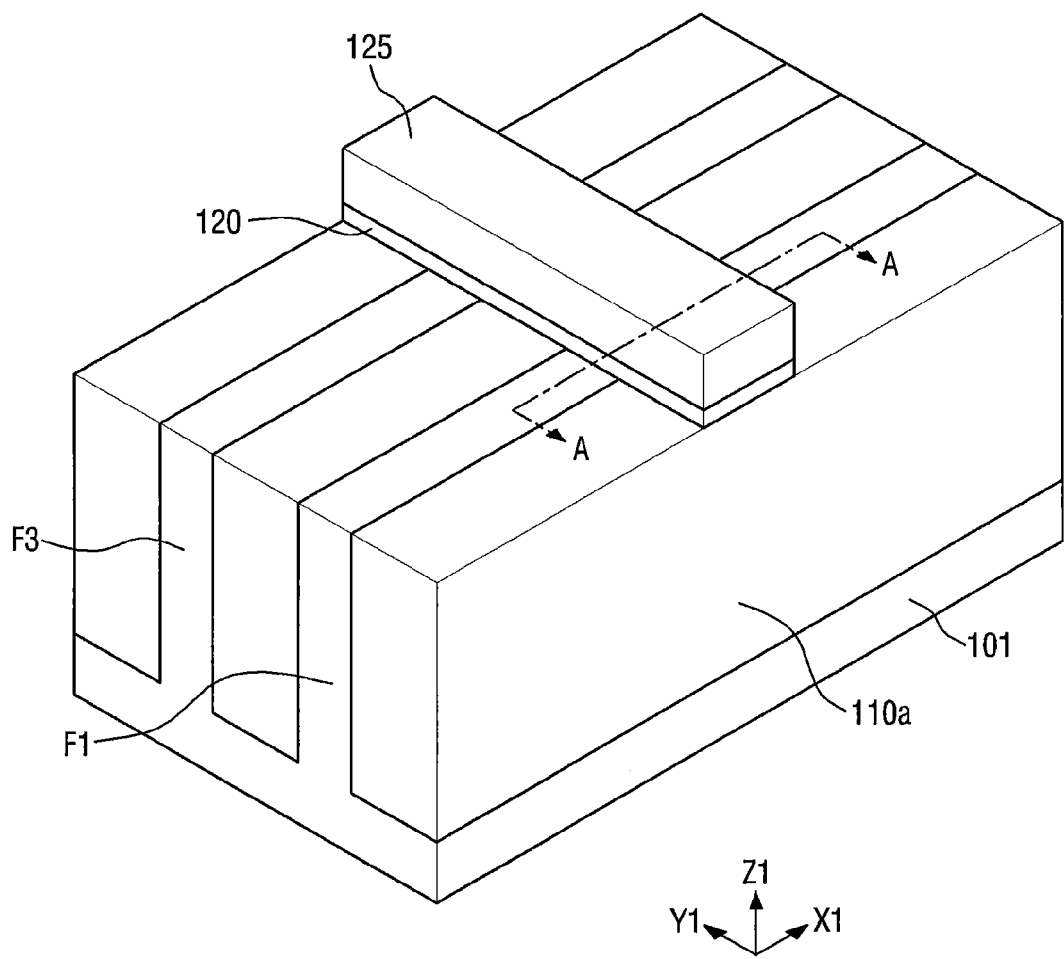
Figure 10:
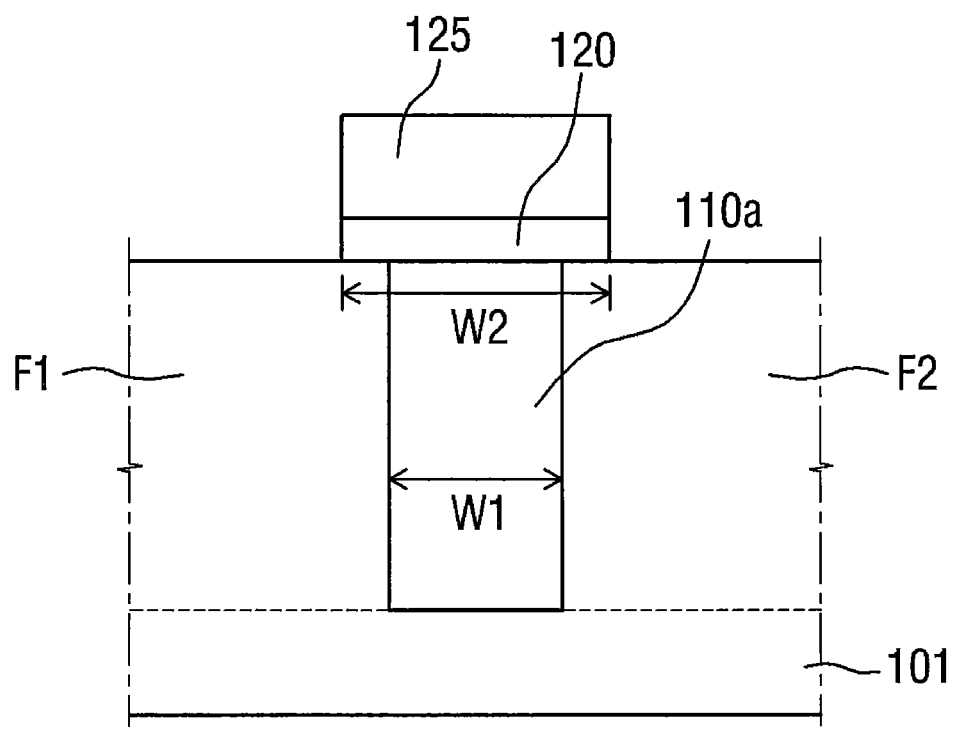

Referring to FIGS. 9 and 10, the hard mask 125a and the etch-stop layer 120a are sequentially patterned to form a hard mask pattern 125 and an etch-stop layer pattern 120. Specifically, the hard mask 125a and the etch-stop layer 120a are patterned to expose the top surfaces of the first through fourth fins F1 through F4. The hard mask pattern 125 and the etch-stop layer pattern 120 are disposed on the trench T1 and cover the field insulating layer 110a that fills the trench T1. To cover the trench T1, the hard mask pattern 125 and the etch-stop layer pattern 120 may be formed in a direction intersecting the first through fourth fins F1 through F4. For example, if the first through fourth fins F1 through F4 extend in the first direction X1, the trench T1 extends in the second direction Y1. Therefore, the hard mask pattern 125 and the etch-stop layer pattern 120 may be formed to extend in the second direction Y1, i.e., the direction in which the trench T1 extends.

The hard mask pattern 125 and the etch-stop layer pattern 120 may partially cover the first through fourth fins F1 through F4. Referring to FIG. 10, a width W2 of each of the hard mask pattern 125 and the etch-stop layer pattern 120 in the first direction X1 is greater than a width W1 of the trench T1 in the first direction X1. Therefore, part of the etch-stop layer pattern 120 may be disposed on the first fin F1 and the second fin F2 on both sides of the trench T1 and disposed on the third fin F3 and the fourth fin F4 on both sides of the trench T1.

Since the top surface of the etch-stop layer 120a is higher than the top surfaces of the first through fourth fins F1 through F4, a top surface of the etch-stop layer pattern 120 is higher than the top surfaces of the first through fourth fins F1 through F4.

Figure 14:
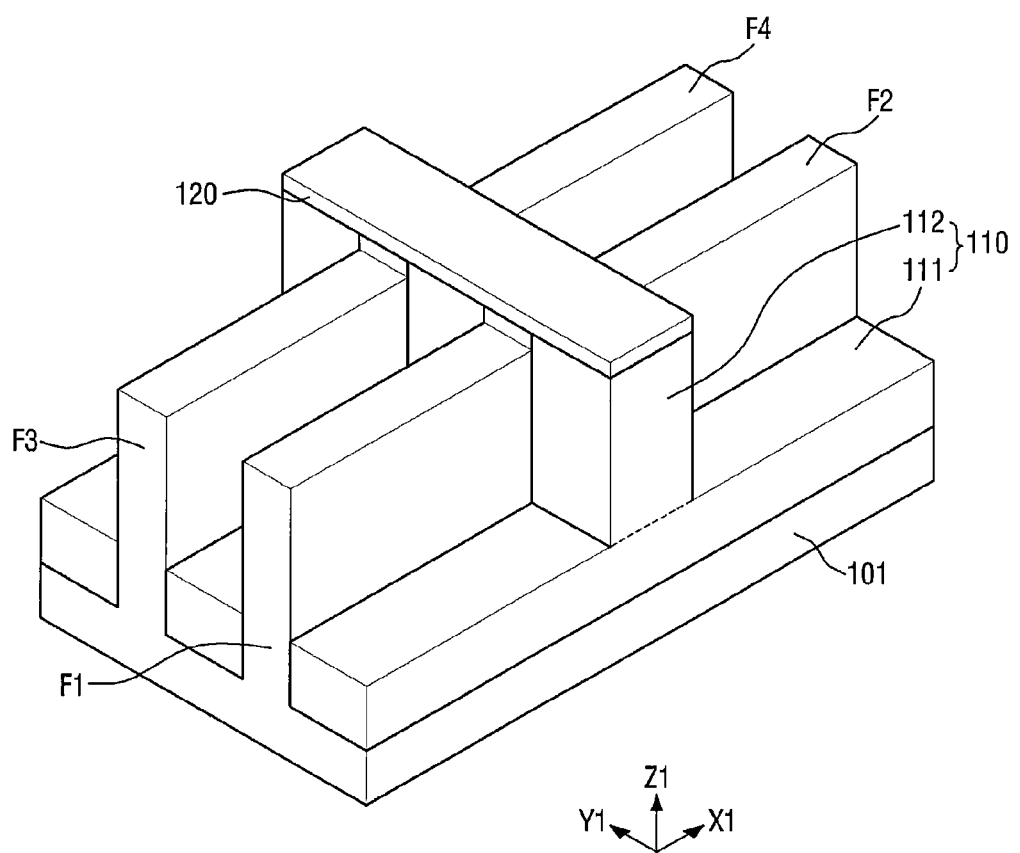

Next, the field insulating layer 110a is etched using the etch-stop layer pattern 120 and the hard mask pattern 125 as a mask, thereby partially exposing the sidewalls of the first through fourth fins F1 through F4. As shown in FIG. 14, the etching of the field insulating layer 110a may divide the field insulating layer 110a into a second field insulating layer 112 that is disposed in the trench T1 and a first field insulating layer 111 that is formed on the substrate 101 and partially covers the sidewalls of the first through fourth fins F1 through F4.

The first field insulating layer 111 and the second field insulating layer 112 may be formed as follows.

Figure 11:
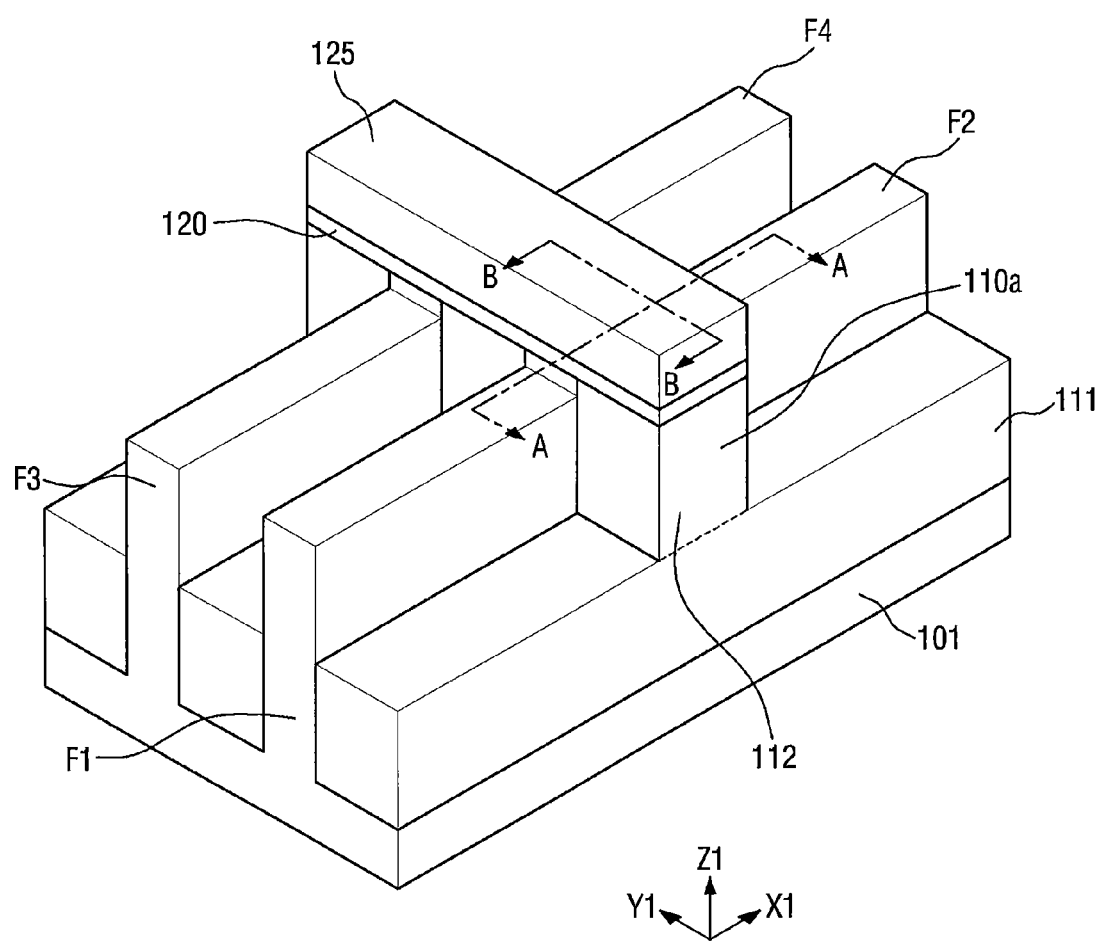
Figure 12:
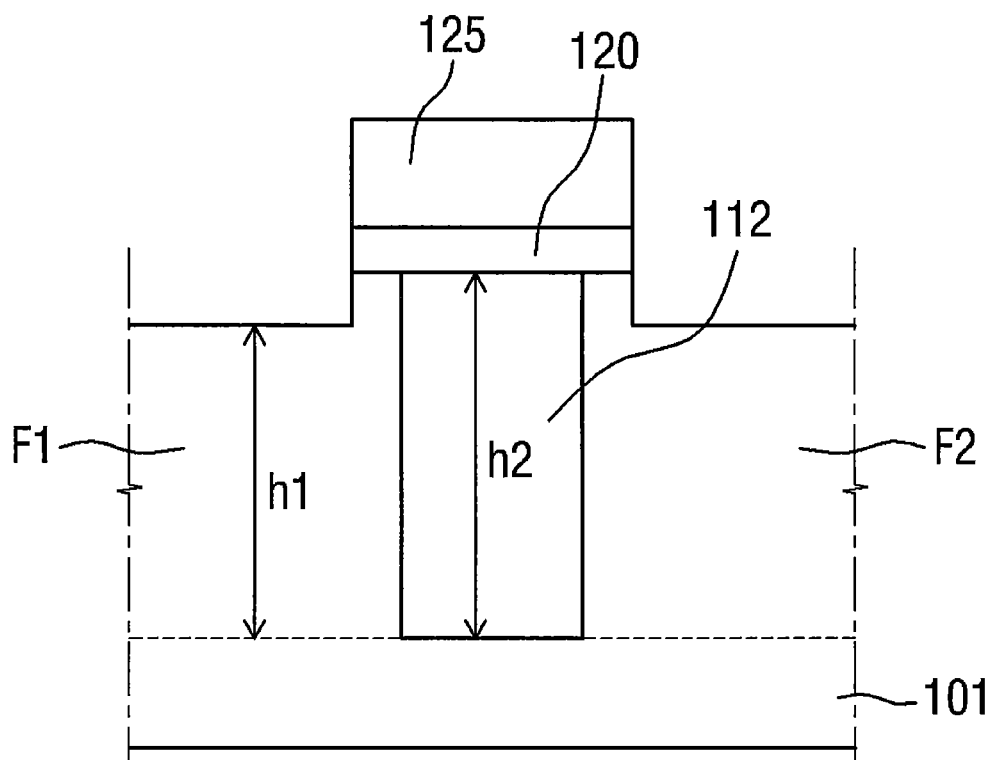
Figure 13:
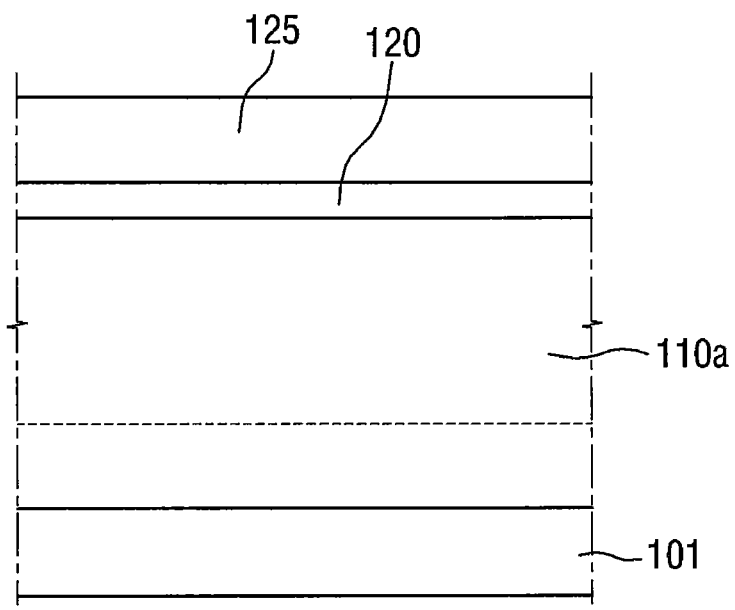

Referring to FIGS. 11 through 13, the field insulating layer 110a is etched using the etch-stop layer pattern 120 and the hard mask pattern 125 as a mask. Accordingly, the sidewalls of the first through fourth fins F1 through F4 are partially exposed. The field insulating layer 110a disposed in the trench T1 may not be etched by the etch-stop layer pattern 120. Instead, the field insulating layer 110a disposed in regions where the etch-stop layer pattern 120 and the hard mask pattern 125 are not disposed may be etched.

When the field insulating layer 110a is etched, the first through fourth fins F1 through F4 may also be partially etched. Referring to FIG. 12, since the first and second fins F1 and F2 are partially etched, a height h1 of each of the first and second fins F1 and F2 may be lower than a height h2 of the field insulating layer 110a that fills the trench T1. In other words, the top surfaces of the first and second fins F1 and F2 may be lower than a bottom surface of the etch-stop layer pattern 120. Here, portions of the first through fourth fins F1 through F4 that are covered by the hard mask pattern 125 and the etch-stop layer pattern 120 are not etched.

Referring to FIG. 14, the hard mask pattern 125 is removed. After the removal of the hard mask pattern 125, a cleaning process is performed.

During the cleaning process, the field insulating layer 110a in regions where the etch-stop layer pattern 120 and the hard mask pattern 125 are not disposed is additionally etched to form the first field insulating layer 111. However, the field insulating layer 110a in the trench T1, that is, the second field insulating layer 112 is not etched due to the etch-stop layer pattern 120.

Figure 15:
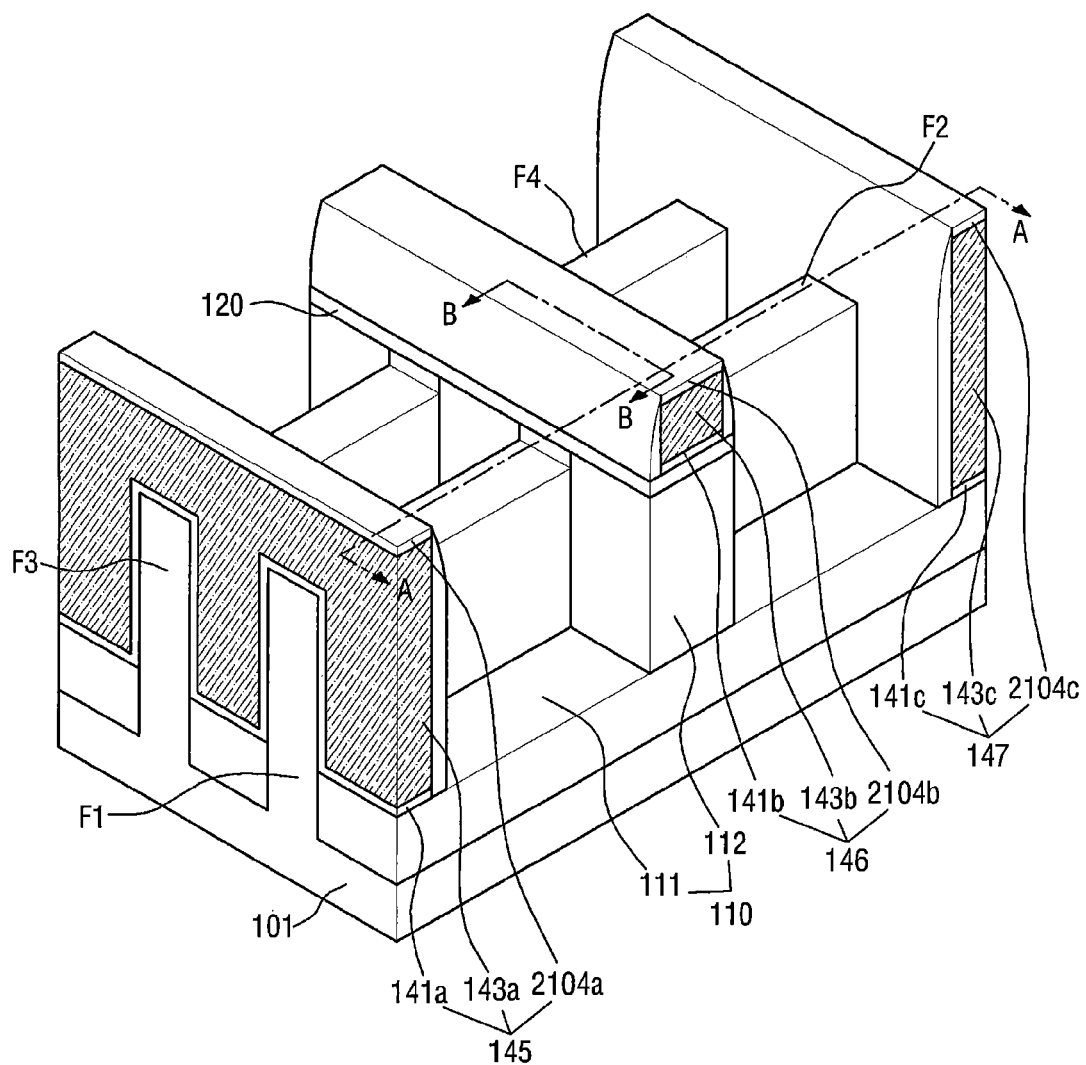
Figure 16:
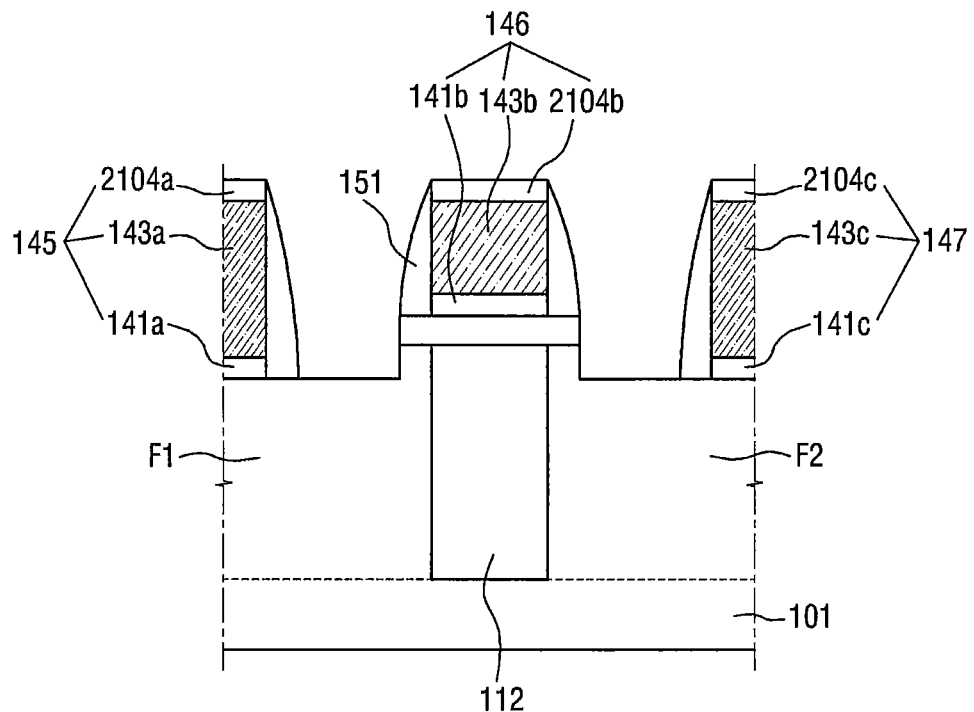
Figure 17:
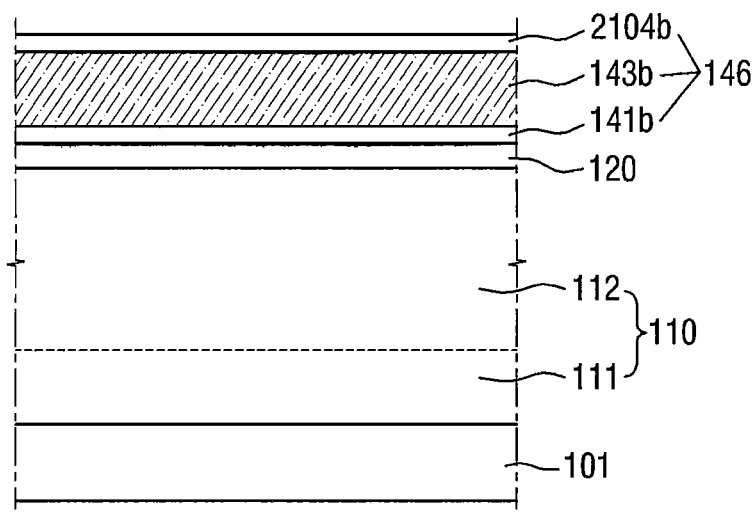

Referring to FIGS. 15 through 17, a first dummy gate 145, a second dummy gate 146, and a third dummy gate 147 are formed on the substrate 101. Specifically, the first dummy gate 145 is formed on the first and third fins F1 and F3, the second dummy gate 146 is formed on the etch-stop layer pattern 120, and the third dummy gate 147 is formed on the second and fourth fins F2 and F4. The first dummy gate 145 may extend in the second direction Y1 to intersect the first and third fins F1 and F3 and may be formed along the sidewalls and top surfaces of the first and third fins F1 and F3. The third dummy gate 147 may extend in the second direction Y1 to intersect the second and fourth fins F2 and F4 and may be formed along the sidewalls and top surfaces of the second and fourth fins F2 and F4. The second dummy gate 146 may extend in the second direction Y1.

The first through third dummy gates 145 through 147 are separated from each other. The first and third fins F1 and F3 are exposed between the first and second dummy gates 145 and 146. The second and fourth fins F2 and F4 are exposed between the second and third dummy gates 146 and 147.

The first through third dummy gates 145 through 147 may respectively include first through third dummy gate insulating layers 141a through 141c, first through third dummy gate electrodes 143a through 143c, and first through third dummy gate mask patterns 2104a through 2104c formed sequentially.

The first through third dummy gate insulating layers 141a through 141c may be, for example, silicon oxide layers, and the first through third dummy gate electrodes 143a through 143c may be, for example, polysilicon.

As shown in FIG. 16, spacers 151 may be formed on sidewalls of the first through third dummy gate electrodes 143a through 143c and may expose top surfaces of the first through third dummy gate mask patterns 2104a through 2104c. The spacers 151 formed on the sidewalls of the second dummy gate electrode 143b are disposed on the etch-stop layer pattern 120.

Each of the spacers 151 may be a silicon nitride layer or a silicon oxynitride layer. In the drawings, each of the spacers 151 is a single layer. However, the present inventive concept is not limited thereto, and each of the spacers 151 may include a plurality of layers.

Figure 18:
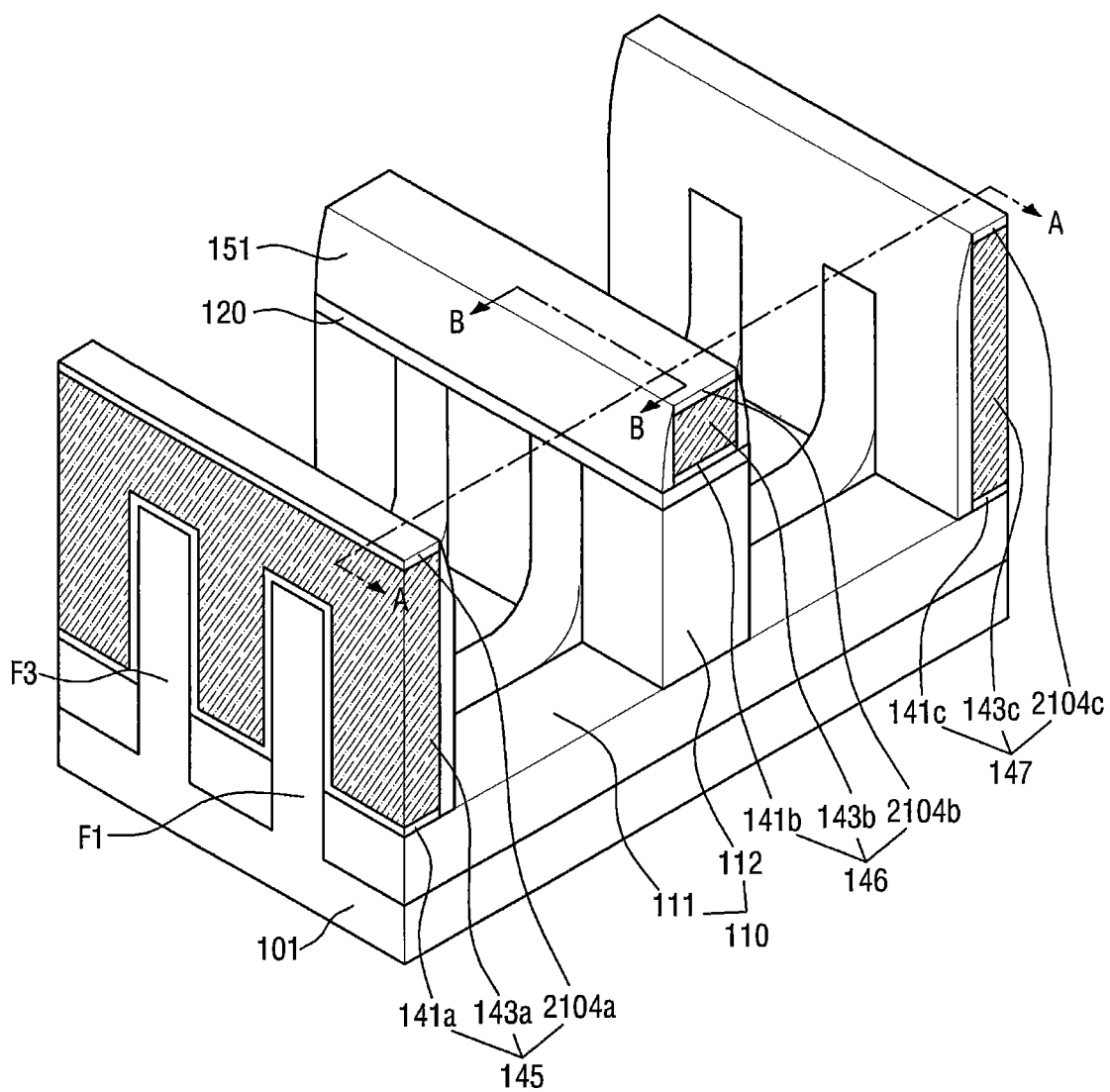
Figure 19:
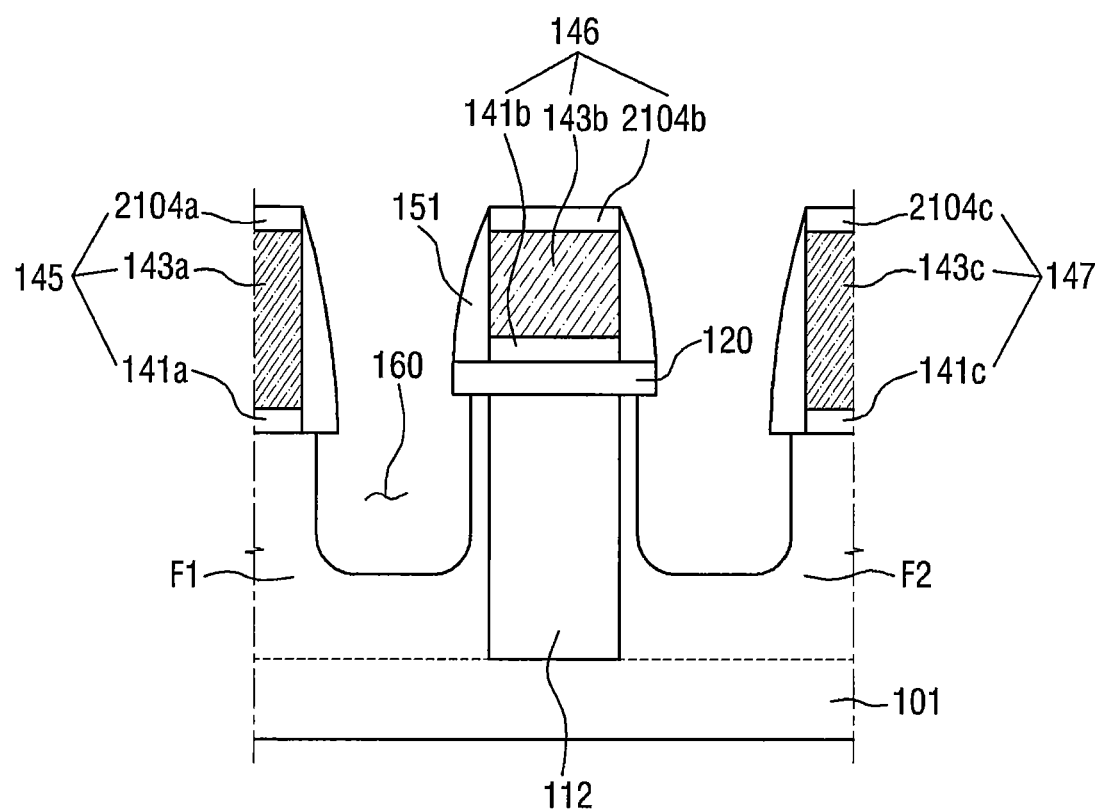

Referring to FIGS. 18 and 19, recesses 160 are formed in the first through fourth fins F1 through F4. The recesses 160 are formed in the first fin F1 and the third fin F3 between the first and second dummy gates 145 and 146 and in the second fin F2 and the fourth fin F4 between the second and third dummy gates 146 and 147.

The recesses 160 may partially expose the bottom surface of the etch-stop layer pattern 120 as shown in FIG. 19. However, since the width of the etch-stop layer pattern 120 and a width of a space between the spacers 151 are greater than a width of the second field insulating layer 112, the second field insulating layer 112 is not exposed by the recesses 160.

Figure 20:
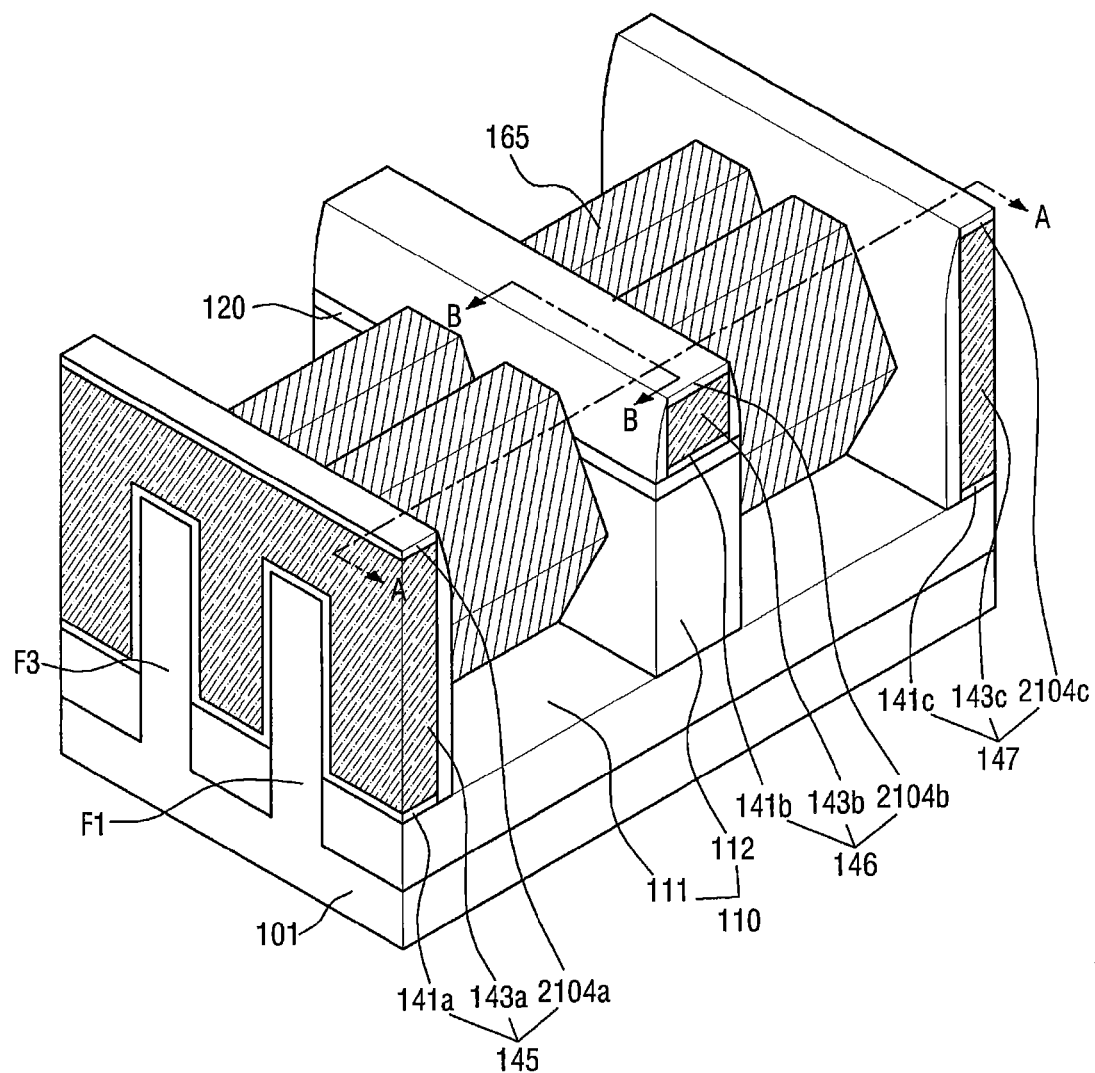
Figure 21:
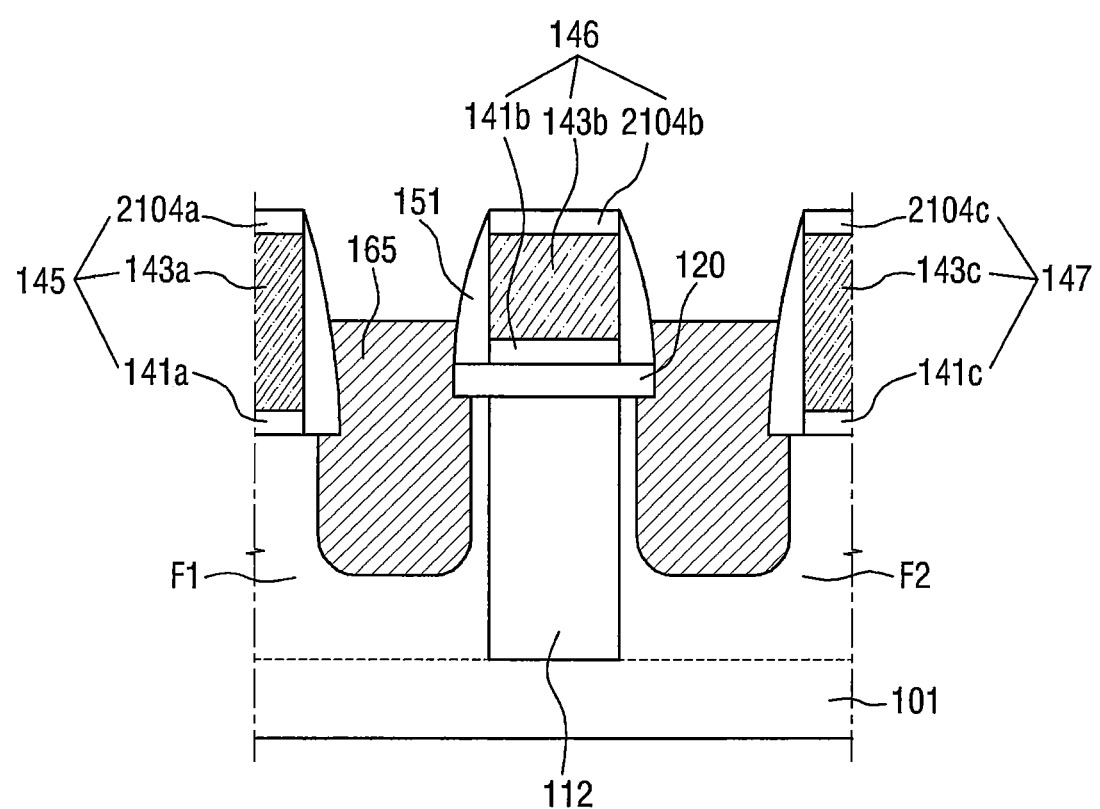

Referring to FIGS. 20 and 21, source/drain regions 165 are formed in the recesses 160. The source/drain regions 165 are separated from the second field insulating layer 112.

When the recesses 160 are formed, the bottom surface of the etch-stop layer pattern 120 is partially exposed as described above. If the source/drain regions 165 are formed in the recesses 160, they may cover the exposed bottom surface of the etch-stop layer pattern 120. Therefore, the source/drain regions 165 may have a tuck structure. Specifically, the source/drain regions 165 may be tucked under the etch-stop layer pattern 120. That is, the source/drain regions 165 may also be formed under the spacers 151.

The source/drain regions 165 may be elevated source/drain regions. That is, top surfaces of the source/drain regions 165 may be higher than the top surfaces of the first through fourth fins F1 through F4. The source/drain regions 165 may be separated from the first through third dummy gates 145 through 147 by the spacers 151.

When a semiconductor device to be formed is a P-type transistor, the source/drain regions 165 may include a compressive stress material. The compressive stress material may be a material (e.g., SiGe) having a greater lattice constant than Si. The compressive stress material can improve the mobility of carriers in a channel region by applying compressive stress to the first through fourth fins F1 through F4.

On the other hand, when a semiconductor device to be formed is an N-type transistor, the source/drain regions 165 may include the same material as the substrate 101 or the first through fourth fins F1 through F4 or may include a tensile stress material. For example, when the substrate 101 or the first through fourth fins F1 through F4 include Si, the source/drain regions 165 may include Si or a material (e.g., SiC) having a smaller lattice constant than Si.

The source/drain regions 165 may have various shapes. For example, the source/drain regions 165 may have at least one of a diamond shape and a circular shape. In FIGS. 20 and 21, the source/drain regions 165 have a diamond shape (a pentagonal shape or a hexagonal shape).

Figure 22:
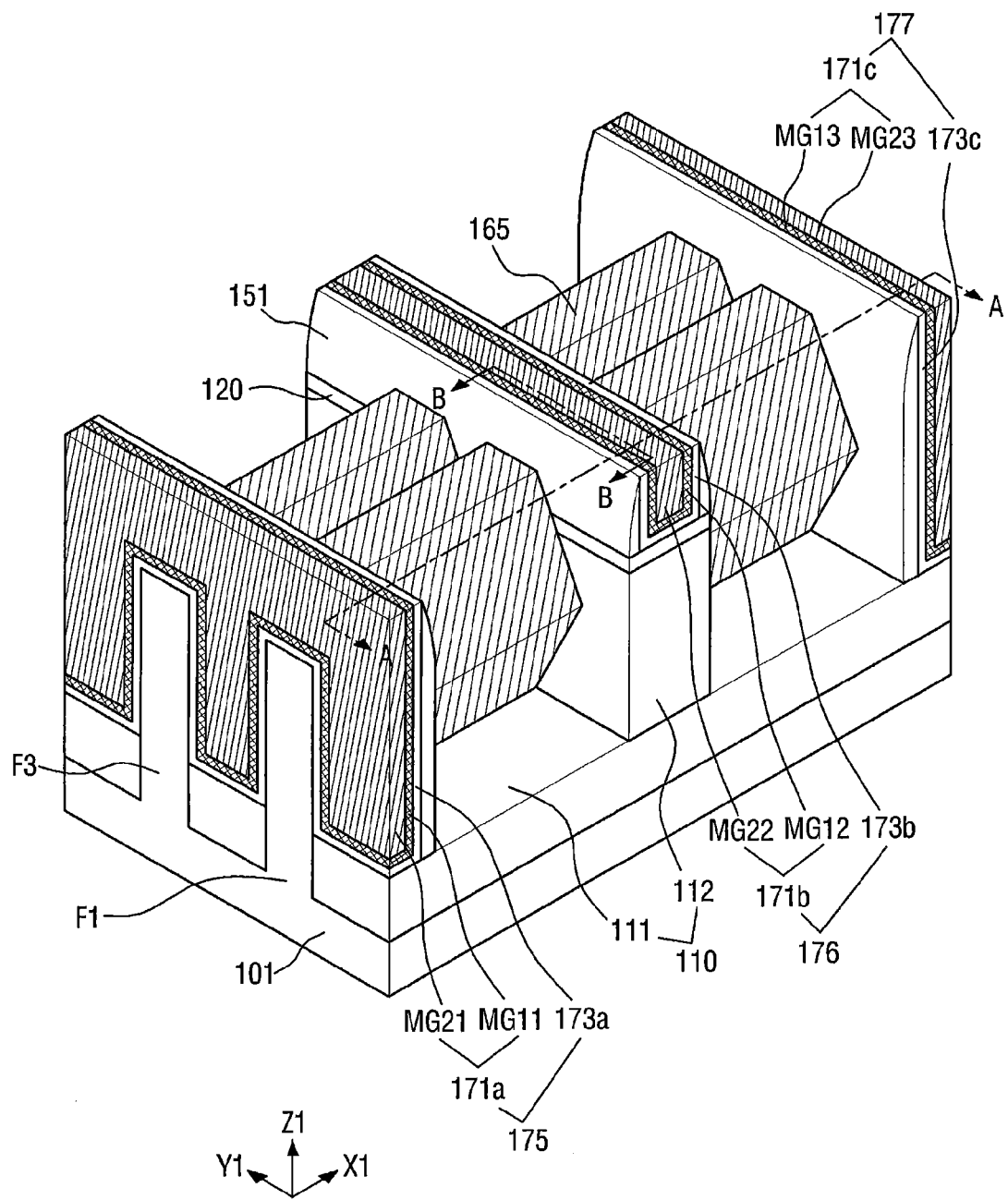
Figure 23:
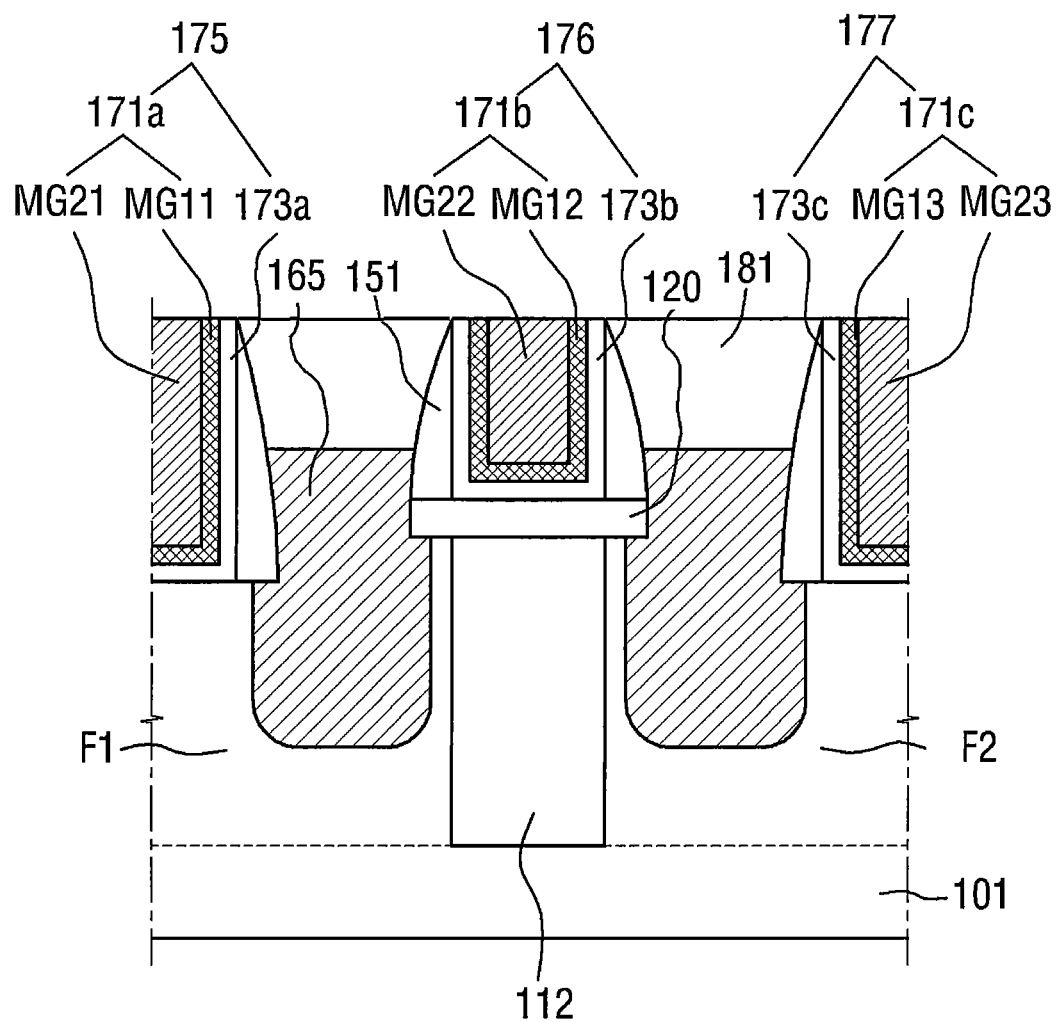
Figure 24:
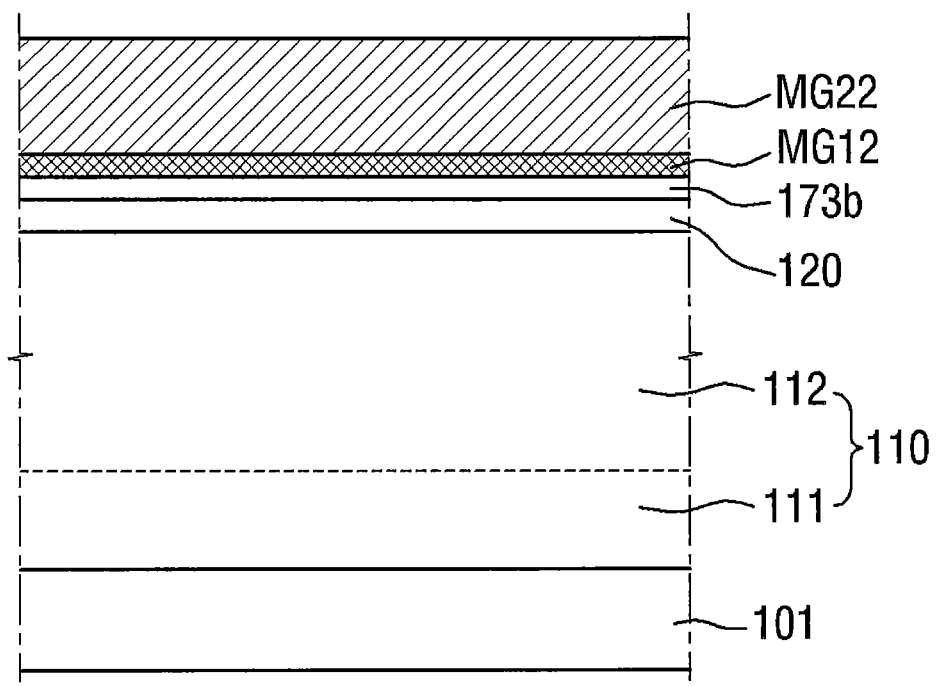

Referring to FIGS. 22 through 24, the first interlayer insulating film 181 is formed to cover the source/drain regions 165. The first interlayer insulating film 181 exposes top surfaces of the first through third dummy gates 145 through 147. The first interlayer insulating film 181 may include at least one of an oxide layer and an oxynitride layer. For ease of description, the first interlayer insulating film 181 is not illustrated in FIG. 22.

The first through third dummy gates 145 through 147 are replaced by first through third gate structures 175 through 177, respectively. The first dummy gate 145 may be replaced by the first gate structure 175, the second dummy gate 146 may be replaced by the second gate structure 176, and the third dummy gate 147 may be replaced by the third gate structure 177.

The first and third gate structures 175 and 177 may be normal gate structures, and the second gate structure 176 may be a dummy gate structure. A normal gate structure actually functions as a gate of a transistor, but a dummy gate structure does not function as a gate of a transistor. However, the second gate structure 176 has a similar shape to the shapes of the first and third gate structures 175 and 177 and is formed in the same way as the first and third gate structures 175 and 177.

Bottom surfaces of the first and third gate structures 175 and 177 may be formed at a height equal to or lower than a bottom surface of the second gate structure 176. This is because upper portions of the first through fourth fins F1 through F4 are partially etched when the etch-stop layer pattern 120 is formed, when the second gate structure 176 is formed on the etch-stop layer pattern 120, and when the first and second field insulating layers 111 and 112 are formed. The etch-stop layer pattern 120 is not disposed on the bottom surfaces of the first and third gate structures 175 and 177.

The first through third gate structures 175 through 177 may include first through third gate insulating layers 173a through 173c and metal layers 171a through 171c, respectively.

The first through third gate structures 175 through 177 may include the metal layers 171a through 171c, respectively. Each of the first through third gate structures 175 through 177 may include a metal layer 171a, 171b or 171c consisting of two or more metal layers. A first metal layer MG11, MG12 or MG13 adjusts a work function, and a second metal layer MG21, MG22 or MG23 fills a space formed by the first metal layer MG11, MG12 or MG13. The first metal layers MG11 through MG13 may include at least one of TiN, TaN, TiC and TaC. In addition, the second metal layers MG21 through MG23 may include W or Al. Alternatively, the metal layers 171a through 171c may be formed of Si, SiGe, etc. other than metal. The metal layers 171a through 171c may be formed by, but not limited to, a replacement process.

The first gate insulating layer 173a may be formed between the first and third fins F1 and F3 and the metal layer 171a, the third gate insulating layer 173c may be formed between the second and fourth fins F2 and F4 and the metal layer 171c, and the second gate insulating layer 173b may be formed between the etch-stop layer pattern 120 and the metal layer 171b.

Referring to FIG. 22, the first gate insulating layer 173a may be formed along the top surfaces of the first and third fins F1 and F3 and upper portions of side surfaces of the first and third fins F1 and F3. The second gate insulating layer 173b may be formed along a top surface of the etch-stop layer pattern 120. The third gate insulating layer 173c may be formed along the top surfaces of the second and fourth fins F2 and F4 and upper portions of side surfaces of the second and fourth fins F2 and F4. In addition, the first and third gate insulating layers 173a and 173c may be disposed between the metal layers 171a and 171c and the first field insulating layer 111. The first through third gate insulating layers 173a through 173c may include a high-k material having a higher dielectric constant than a silicon oxide layer. For example, the first through third gate insulating layers 173a through 173c may include $HfO_2$, $ZrO_2$, or $Ta_2O_5$.

The second gate structure 176 is separated from the source/drain regions 165. As described above, when the first and second field insulating layers 111 and 112 are formed, the etch-stop layer pattern 120 is formed on the trench T1. Therefore, the second field insulating layer 112 within the trench T1 is not etched. However, if the etch-stop layer pattern 120 is not formed, the second field insulating layer 112 is partially etched together with the first field insulating layer 111 during the cleaning process (see FIG. 14). Accordingly, the second gate structure 176 is formed in the trench T1. In other words, the bottom surface of the second gate structure 176 may be at a height equal to or lower than the bottom surfaces of the first and third gate structures 175 and 177. In this case, when the source/drain regions 165 are formed, a bridge may be formed between the second dummy gate 146 and each of the source/drain regions 165. Ultimately, a bridge may be formed between the second gate structure 176 and each of the source/drain regions 165. Otherwise, when the second dummy gate 146 is removed and then the second gate structure 176 is formed, side surfaces of the source/drain regions 165 may be partially exposed. As a result, a bridge may be formed between the second gate structure 176 and each of the source/drain regions 165. Furthermore, since a distance between each of the source/drain regions 165 and the second gate structure 176 is small, parasitic capacitance between them may increase.

On the other hand, if the etch-stop layer pattern 120 is formed, the second gate structure 176 is formed on the etch-stop layer pattern 120, not in the trench T1. Therefore, the above problem can be prevented.

Figure 25:
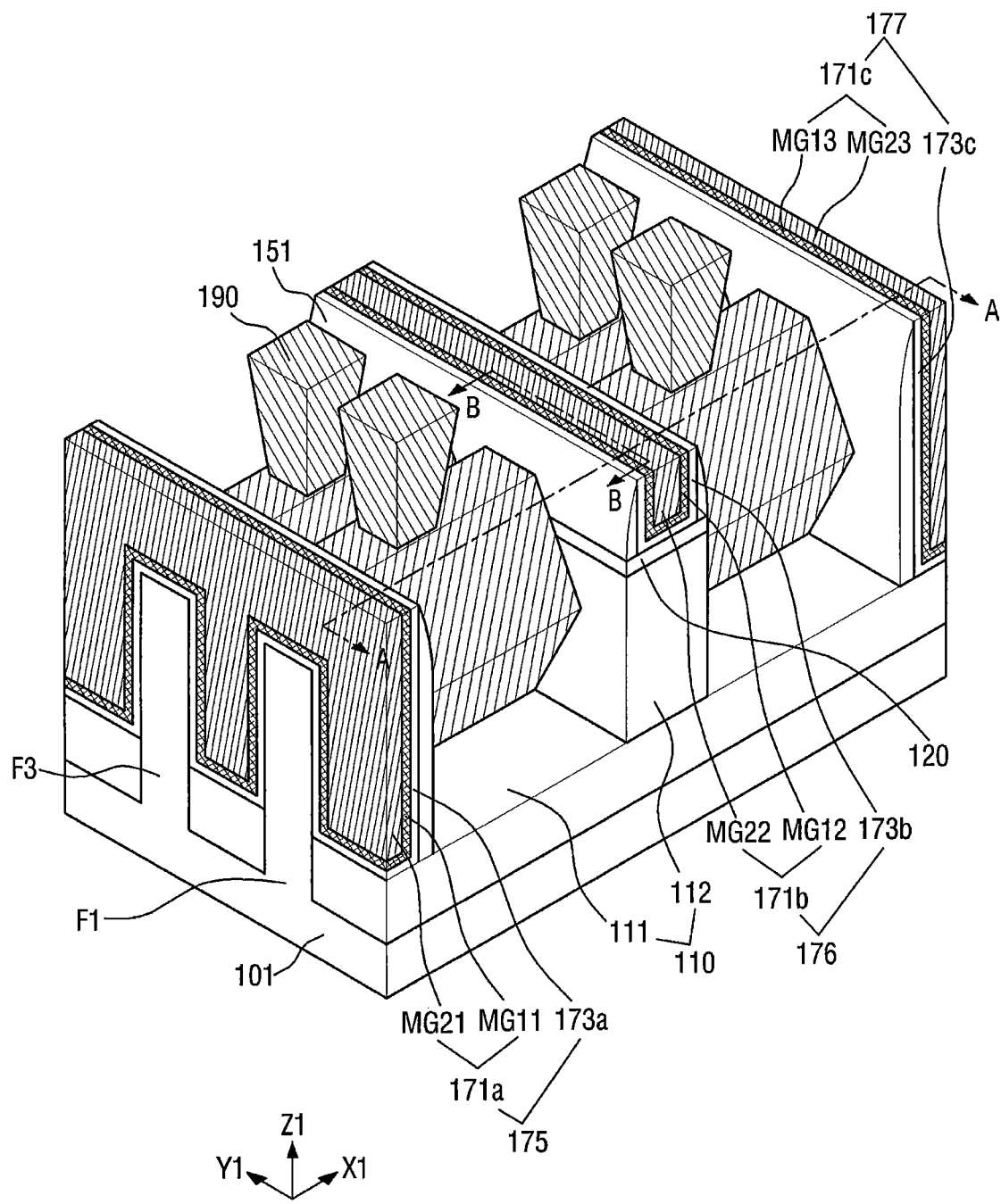
Figure 26:
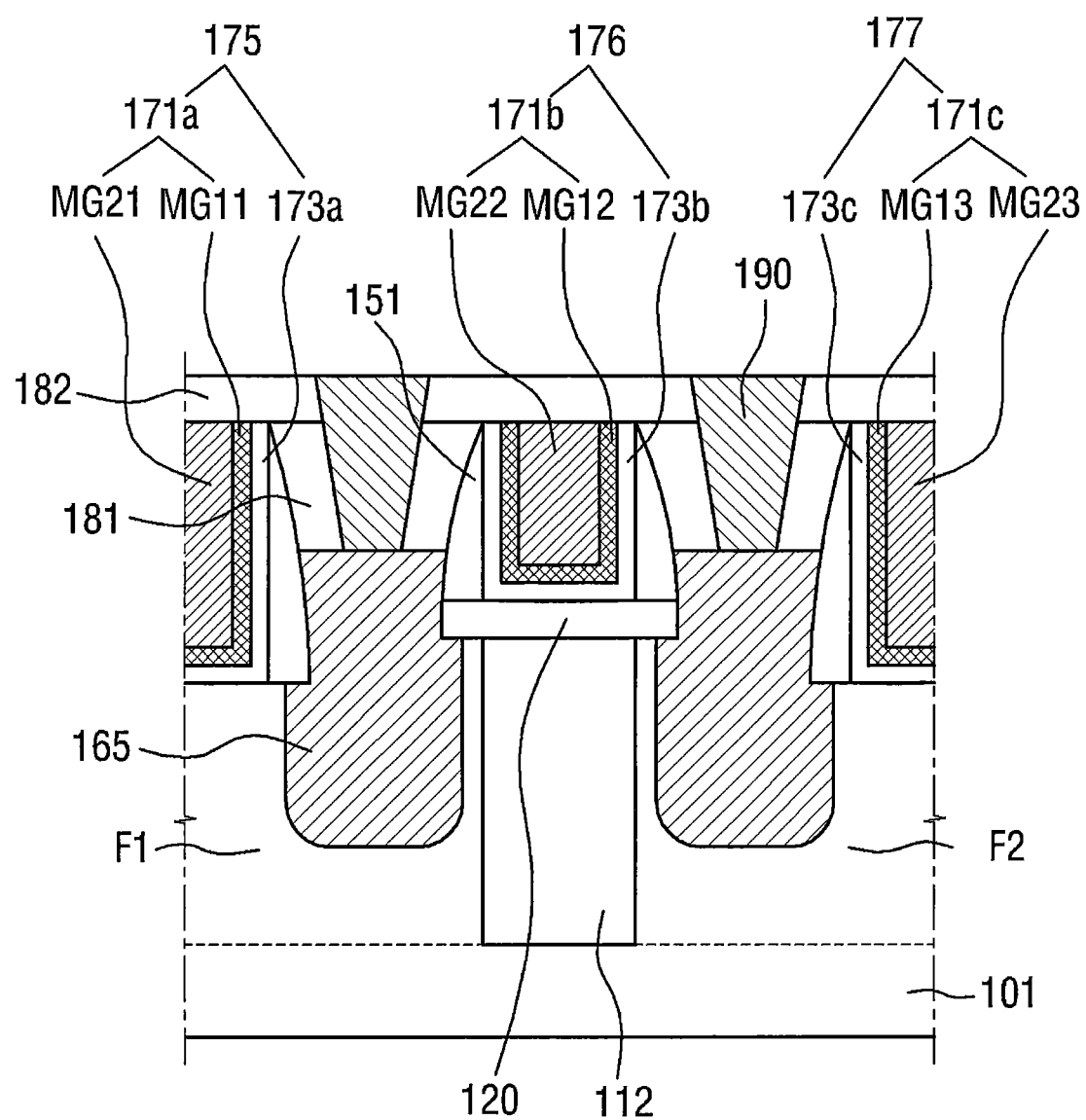
Figure 27:
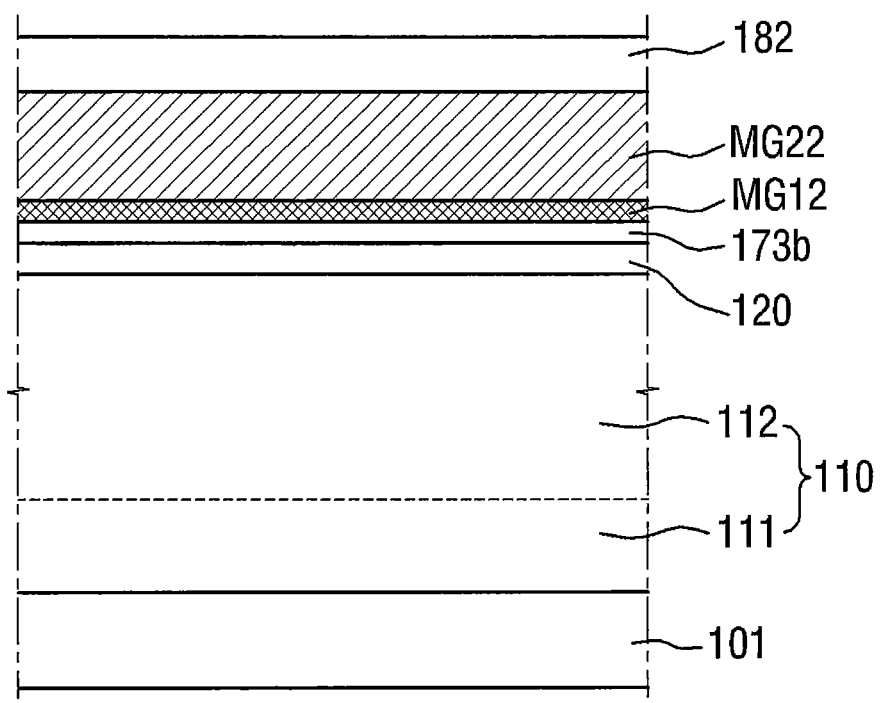

Referring to FIGS. 25 through 27, the second interlayer insulating film 182 is formed to cover the first through third gate structures 175 through 177. The second interlayer insulating film 182 may include the same material as the first interlayer insulating film 181.

Contacts 190 are formed on the source/drain regions 165 to penetrate through the first and second interlayer insulating films 181 and 182. The contacts 190 may electrically connect wiring and the source/drain regions 165. The contacts 190 may be formed of a conductive material such as, but not limited to, W, Al or Cu.

A method of fabricating a semiconductor device according to other embodiments of the present inventive concept will now be described with reference to FIGS. 1 through 13 and 28 through 32. For simplicity, a redundant description of elements already described in the previous embodiment will be omitted, and the current embodiment will hereinafter be described, focusing mainly on differences with the previous embodiment.

FIGS. 28 through 32 are views illustrating a method of fabricating a semiconductor device according to other embodiments of the present inventive concept. For ease of description, a first interlayer insulating film 181 is not illustrated in FIG. 31, and first and second interlayer insulating films 181 and 182 are not illustrated in FIG. 32.

The method of fabricating a semiconductor device according to the current embodiment may be the same as the method of fabricating a semiconductor device according to the previous embodiment in the processes of FIGS. 1 through 6. Referring to FIG. 7, an etch-stop layer 120a and a hard mask 125a are sequentially formed on first through fourth fins F1 through F4 and a field insulating layer 110a. The etch-stop layer 120a may be formed of the same material as the field insulating layer 110a. For example, the field insulating layer 110a may include an oxide layer, and the etch-stop layer 120a may also include an oxide layer.

In the same processes as the processes of FIGS. 7 through 13, an etch-stop layer pattern 120 and a hard mask pattern 125 are formed on a trench T1, and the field insulating layer 110a is etched to partially expose sidewalls of the first through fourth fins F1 through F4. Then, the hard mask pattern 125 is removed.

Figure 28:
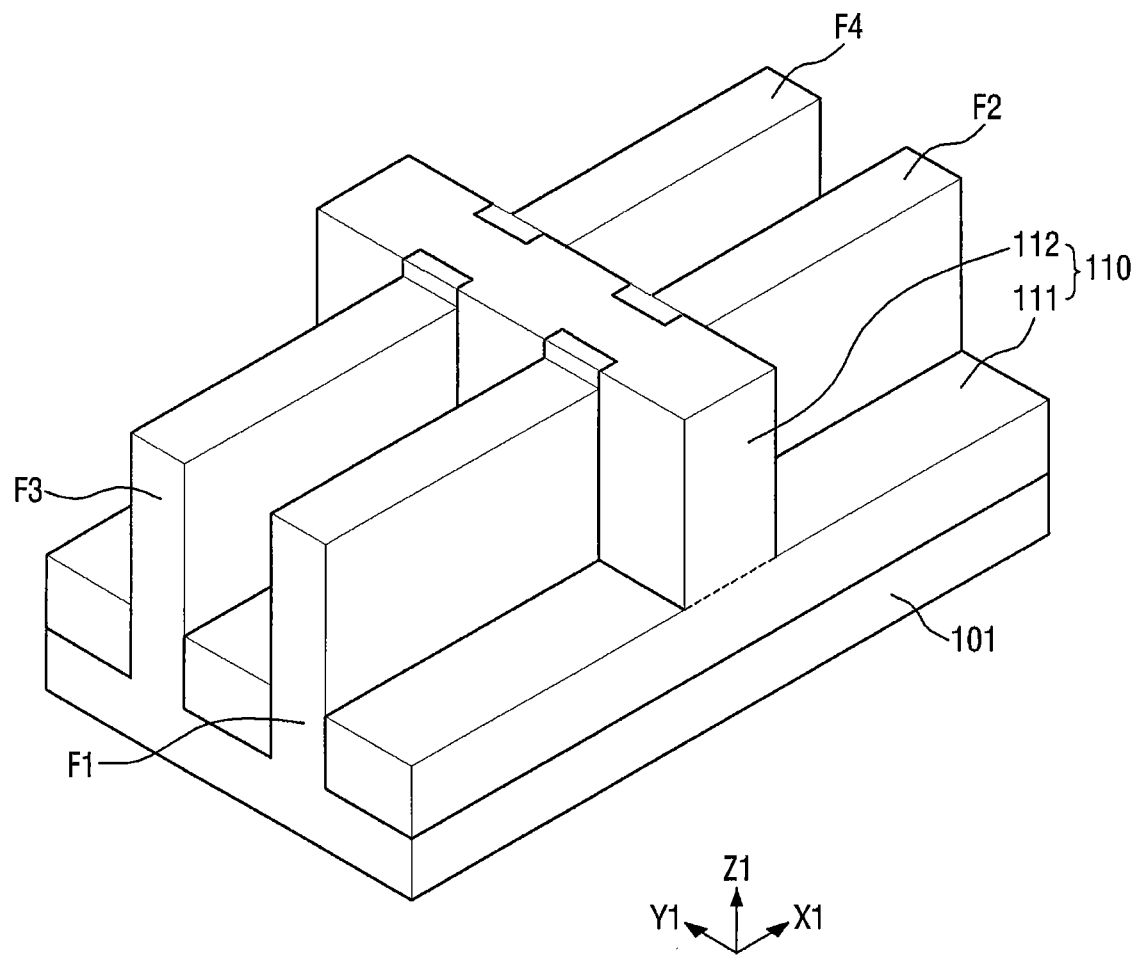
FIGS. 28 through 32 are views illustrating a method of fabricating a semiconductor device according to other embodiments of the present inventive concept.

Referring to FIG. 28, after the removal of the hard mask pattern 125, a cleaning process is performed. The cleaning process may result in the formation of a first field insulating layer 111 that partially covers the sidewalls of the first through fourth fins F1 through F4 and a second field insulating layer 112 that is disposed in the trench T1. During the cleaning process, the etch-stop layer pattern 120 is also etched because it includes an oxide layer. However, during the cleaning process, since the etch-stop layer pattern 120 is etched, the .second field insulating layer 112 is not etched. Therefore, as in the method of fabricating a semiconductor device according to the previous embodiment, a top surface of the second field insulating layer 112 may be at a height equal to or higher than top surfaces of the first through fourth fins F1 through F4. Accordingly, a second dummy gate 146 and a second gate structure 176 are not formed in the trench T1. Thus, even if the etch-stop layer pattern 120 is removed, the method of fabricating a semiconductor device according to the current embodiment can have the same effect as the method of fabricating a semiconductor device according to the previous embodiment.

Unlike a field insulating layer 110, the etch-stop layer pattern 120 may include a medium temperature oxide (MTO) layer. The MTO layer has a lower etch rate than a general oxide layer. Therefore, if the etch-stop layer pattern 120 includes the MTO layer, a width thereof can be reduced. In addition, it may be easier to control the cleaning process such that only the etch-stop layer pattern 120, not the second field insulating layer 112, is etched.

Figure 29:
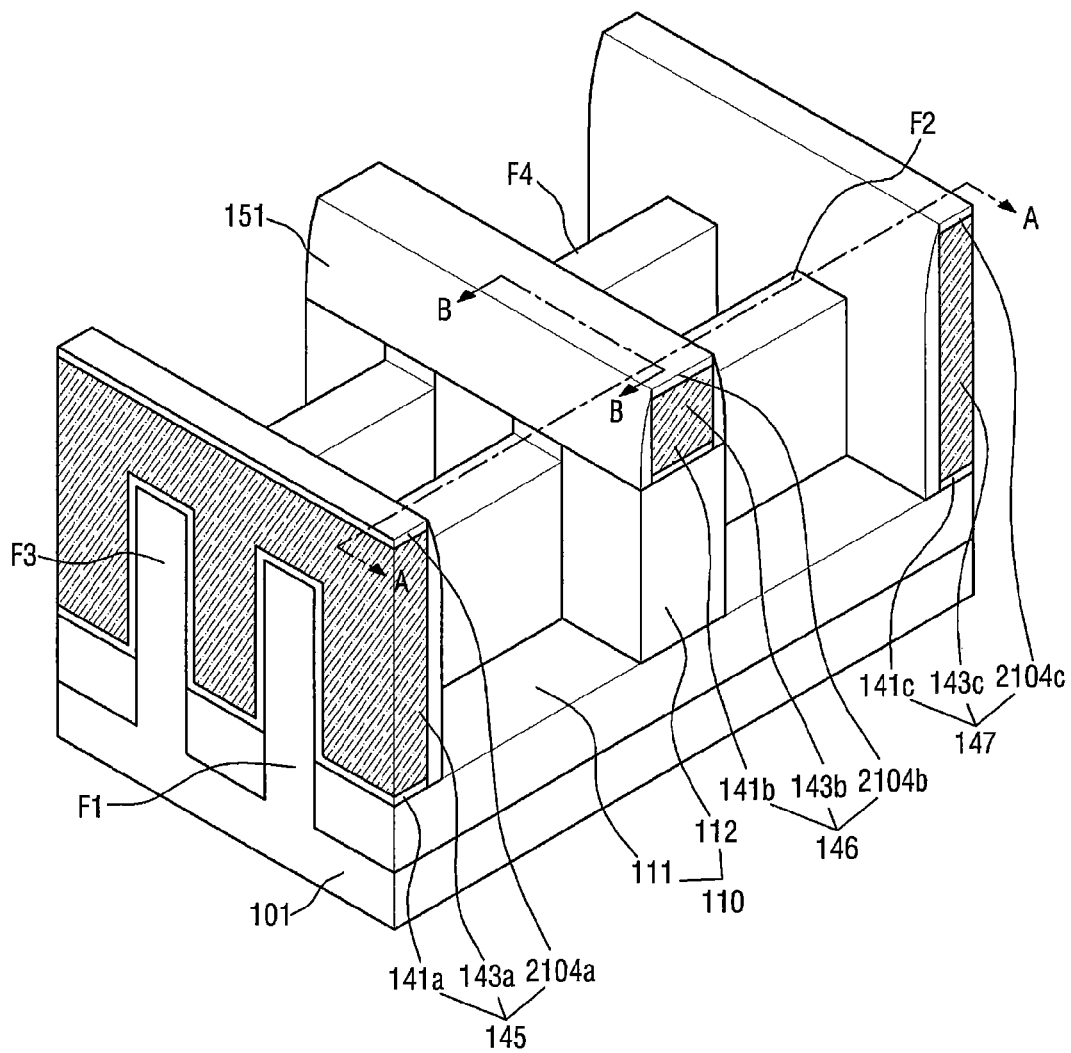

Referring to FIG. 29, a first dummy gate 145, a second dummy gate 146, and a third dummy gate 147 are formed on a substrate 101. Specifically, the first dummy gate 145 is formed on the first and third fins F1 and F3, the second dummy gate 146 is formed on the etch-stop layer pattern 120, and the third dummy gate 147 is formed on the second and fourth fins F2 and F4. The first dummy gate 145 may extend in a second direction Y1 to intersect the first and third fins F1 and F3 and may be formed along the sidewalls and top surfaces of the first and third fins F1 and F3. The third dummy gate 147 may extend in the second direction Y1 to intersect the second and fourth fins F2 and F4 and may be formed along the sidewalls and top surfaces of the second and fourth fins F2 and F4. The second dummy gate 146 may extend in the second direction Y1.

The first through third dummy gates 145 through 147 are separated from each other. The first and third fins F1 and F3 are exposed between the first and second dummy gates 145 and 146. The second and fourth fins F2 and F4 are exposed between the second and third dummy gates 146 and 147.

Spacers 151 may be formed on sidewalls of first through third dummy gate electrodes 143a through 143c and may expose top surfaces of first through third dummy gate mask patterns 2104a through 2104c.

Figure 30:
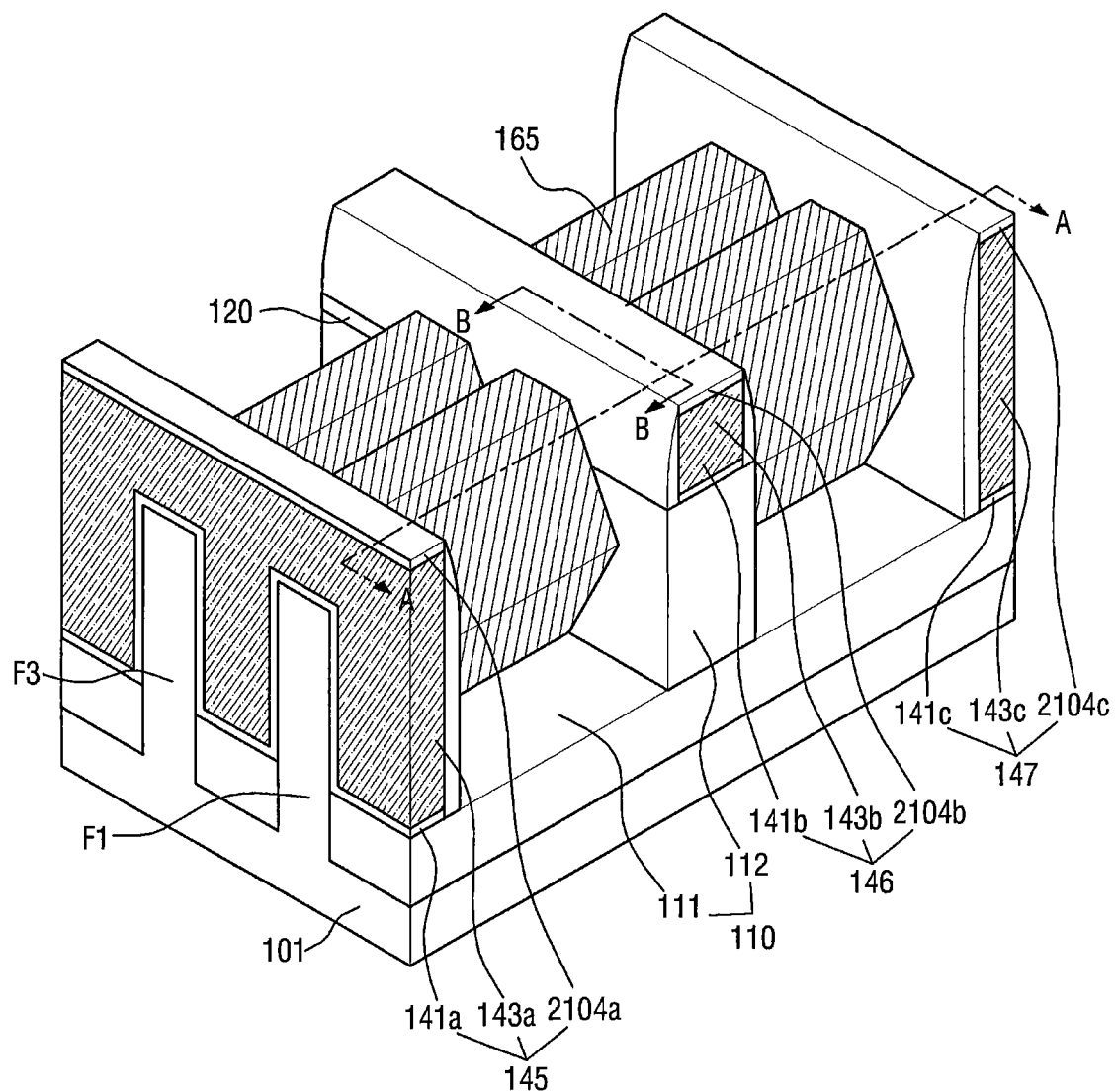

Referring to FIG. 30, source/drain regions 165 are formed in the first through fourth fins F1 through F4. To form the source/drain regions 165, recesses 160 may be formed in the first fin F1 and the third fin F3 between the first and second dummy gates 145 and 146 and in the second fin F2 and the fourth fin F4 between the second and third dummy gates 146 and 147 as shown in FIGS. 18 and 19. Then, the source/drain regions 165 may be formed in the recesses 160.

When the recesses 160 are formed, bottom surfaces of the spacers 151 may be partially exposed. The source/drain regions 165 may cover the exposed bottom surfaces of the spacers 151. Therefore, the source/drain regions 165 may have a tuck structure. Specifically, the source/drain regions 165 may be tucked under the spacers 151. That is, the source/drain regions 165 may also be formed under the spacers 151.

Figure 31:
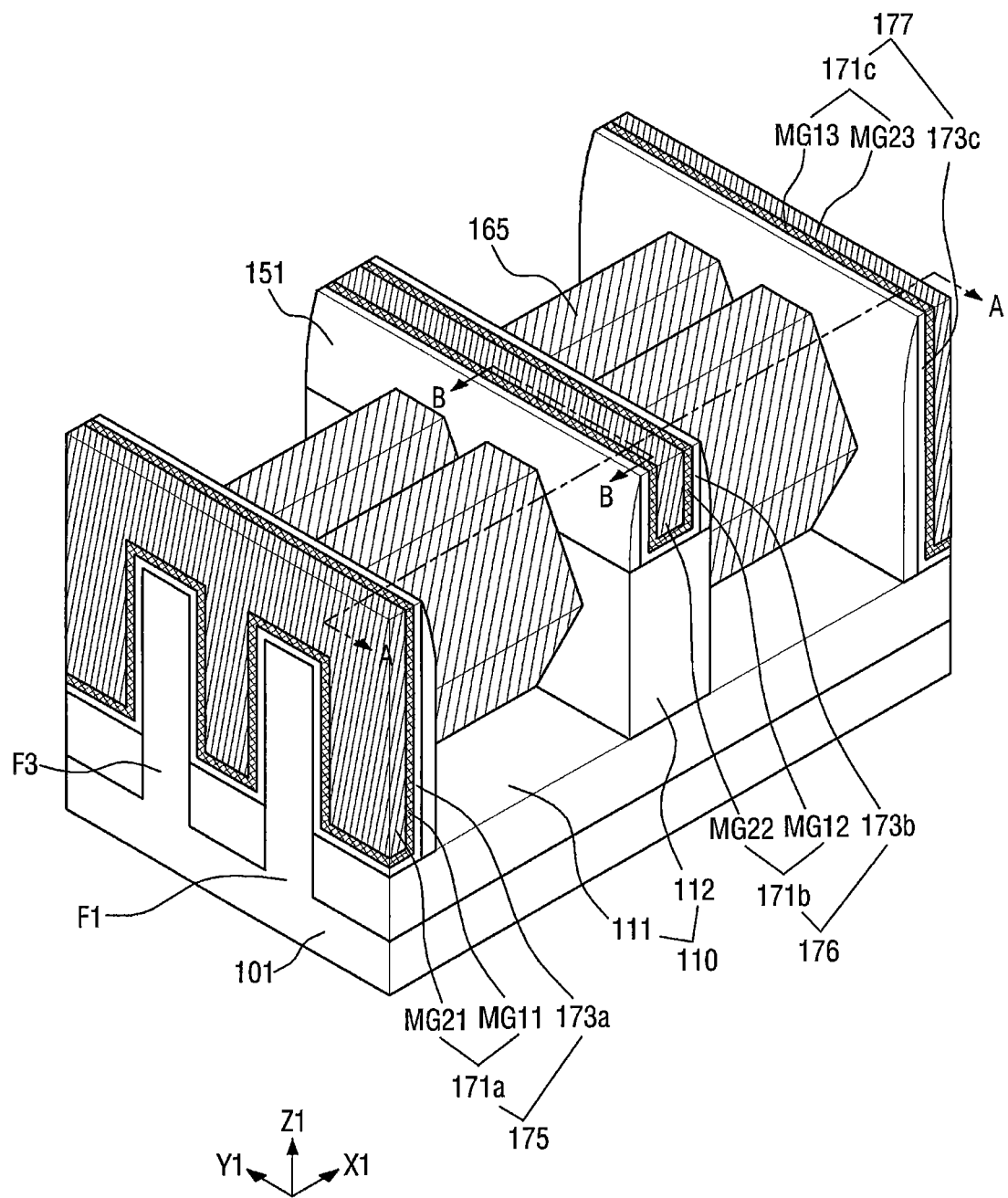

Referring to FIG. 31, the first interlayer insulating film 181 is formed to cover the source/drain regions 165 and expose top surfaces of the first through third dummy gates 145 through 147, as shown in FIG. 26 but not in FIG. 31. Then, the first through third dummy gates 145 through 147 are replaced by first through third gate structures 175 through 177, respectively. The first dummy gate 145 may be replaced by the first gate structure 175, the second dummy gate 146 may be replaced by the second gate structure 176, and the third dummy gate 147 may be replaced by the third gate structure 177.

The first and third gate structures 175 and 177 may be normal gate structures, and the second gate structure 176 may be a dummy gate structure. A normal gate structure actually functions as a gate of a transistor, but a dummy gate structure does not function as a gate of a transistor. However, the second gate structure 176 has a similar shape to the shapes of the first and third gate structures 175 and 177 and is formed in the same way as the first and third gate structures 175 and 177.

Bottom surfaces of the first and third gate structures 175 and 177 may be formed at a height equal to or lower than a bottom surface of the second gate structure 176. This is because the second field insulating layer 112 is not etched despite the absence of the etch-stop layer pattern 120 unlike in FIGS. 22 and 23. Therefore, no bridge is formed between the second gate structure 176 and each of the source/drain regions 165.

Figure 32:
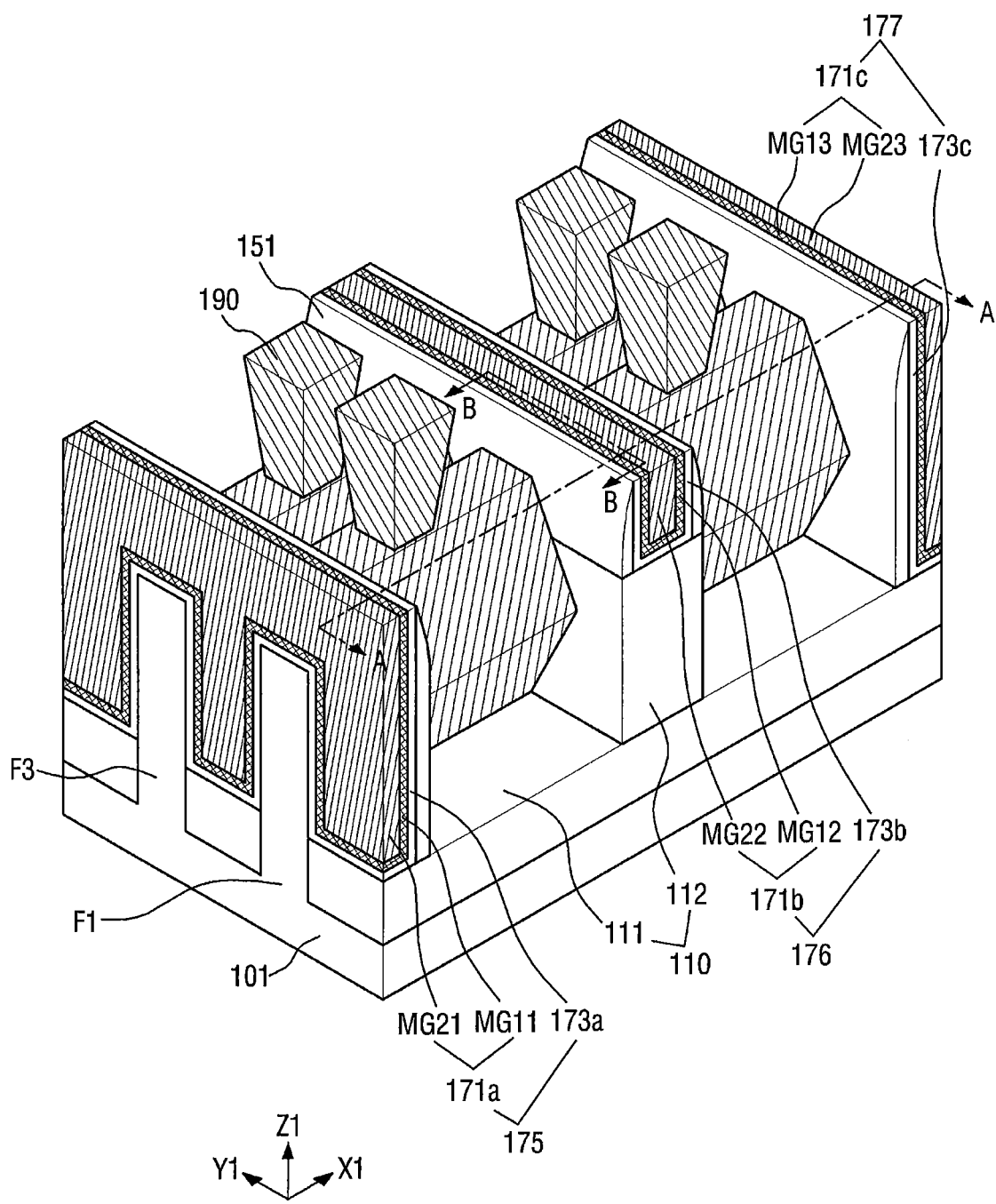

Referring to FIG. 32, the second interlayer insulating film 182 is formed to cover the first through third gate structures 175 through 177, as shown in FIG. 26, but not in FIG. 32. Then, contacts 190 are formed on the source/drain regions 165 to penetrate through the first and second interlayer insulating films 181 and 182. The contacts 190 may electrically connect wiring and the source/drain regions 165. The contacts 190 may be formed of a conductive material such as, but not limited to, W, Al or Cu.

A semiconductor device according to embodiments of the present inventive concept will now be described with reference to FIGS. 33 and 34.

Figure 33:
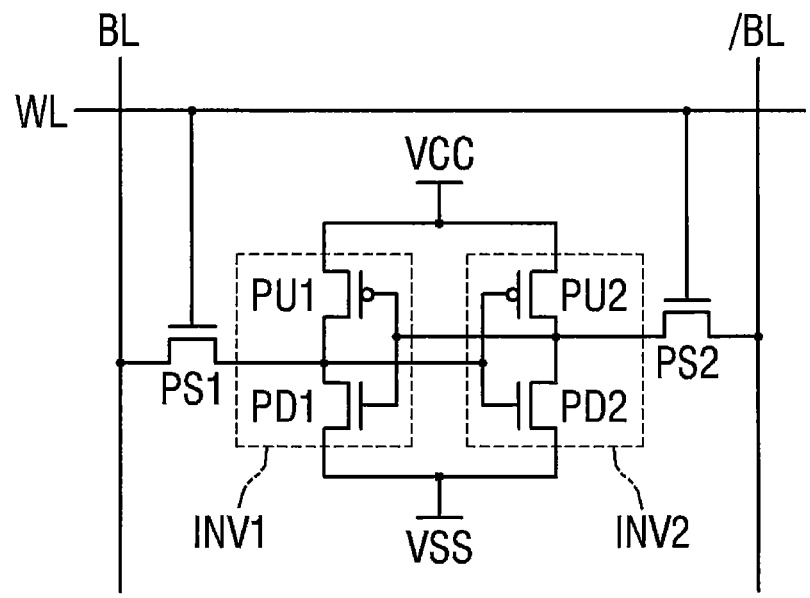
FIGS. 33 and 34 are circuit and layout diagrams of a semiconductor device according to some embodiments of the present inventive concept.
Figure 34:
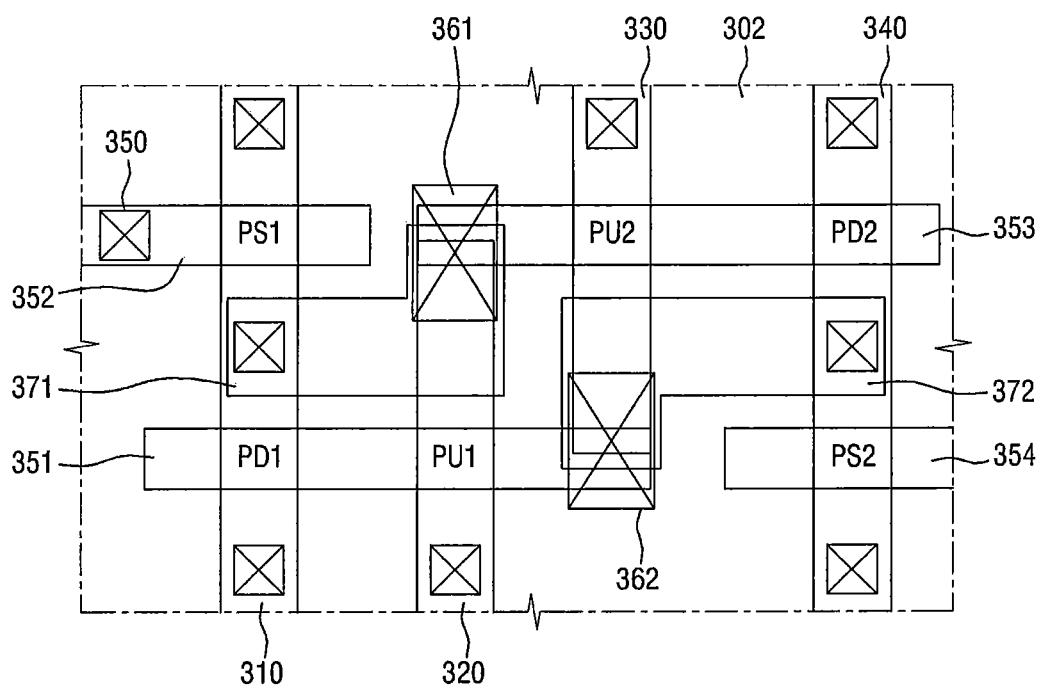

FIGS. 33 and 34 are circuit and layout diagrams of a semiconductor device according to an embodiment of the present inventive concept. The semiconductor device according to the current embodiment is applicable to all devices, each composed of general logic elements that use fin-type transistors. In FIGS. 33 and 34, a static random access memory (SRAM) is illustrated as an example.

Referring to FIG. 33, the semiconductor device according to the current embodiment may include a pair of first and second inverters INV1 and INV2 connected in parallel between a power source node VCC and a ground node VSS and first and second pass transistors PS1 and PS2 respectively connected to output nodes of the first and second inverters INV1 and INV2. The first and second pass transistors PS1 and PS2 may be connected to a bit line BL and a complementary bit line /BL, respectively. Gates of the first and second pass transistors PS1 and PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first and second pull-up transistors PU1 and PU2 may be p-channel metal oxide semiconductor (PMOS) transistors, and the first and second pull-down transistors PD1 and PD2 may be n-channel metal oxide semiconductor (NMOS) transistors.

An input node of the first inverter INV1 is connected to the output node of the second inverter INV2, and an input node of the second inverter INV2 is connected to the output node of the first inverter INV1 so as for the first and second inverters INV1 and INV2 to form a single latch circuit.

Referring to FIGS. 33 and 34, a first fin 310, a second fin 320, a third fin 330 and a fourth fin 340 may extend in a direction (e.g., a vertical direction in FIG. 34) to be separated from each other. The second fin 320 and the third fin 330 may be shorter than the first fin 310 and the fourth fin 340.

In addition, a first gate electrode 351, a second gate electrode 352, a third gate electrode 353, and a fourth gate electrode 354 may extend in another direction (e.g., a horizontal direction in FIG. 34) to intersect the first through fourth fins 310 through 340. Specifically, the first gate electrode 351 may completely intersect the first fin 310 and the second fin 320 and partially overlap an end of the third fin 330. The third gate electrode 353 may completely intersect the fourth fin 340 and the third fin 330 and partially overlap an end of the second fin 320. The second gate electrode 352 and the fourth gate electrode 354 may intersect the first fin 310 and the fourth fin 340, respectively.

The first pull-up transistor PU1 may be defined near the intersection of the first gate electrode 351 and the second fin 320. The first pull-down transistor PD1 may be defined near the intersection of the first gate electrode 351 and the first fin 310. The first pass transistor PS1 may be defined near the intersection of the second gate electrode 352 and the first fin 310. The second pull-up transistor PU2 may be defined near the intersection of the third gate electrode 253 and the third fin 330. The second pull-down transistor PD2 may be defined near the intersection of the third gate electrode 353 and the fourth fin 340. The second pass transistor PS2 may be defined near the intersection of the fourth gate electrode 354 and the fourth fin 340.

Although not specifically illustrated, a recess may be formed on both sides of each of the intersections between the first, second, third and fourth gate electrodes 351, 352, 353 and 354 and the first, second, third and fourth fins 310, 320, 330 and 340, respectively, and a source/drain region may be formed in each of the recesses.

A plurality of contacts 350 may also be formed.

A shared contact 361 connects all of the second fin 320, the third gate line 353 and wiring 371. A shared contact 362 connects all of the third fin 330, the first gate line 351 and wiring 372.

The first pull-up transistor PU1, the second pull-up transistor PU2, the first pull-down transistor PD1, and the second pull-down transistor PD2 may all be implemented as fin-type transistors, i.e., may be formed using the above-described methods of fabricating a semiconductor device, and may be configured to have the structures described above with reference to FIGS. 25 and 32

Figure 35:
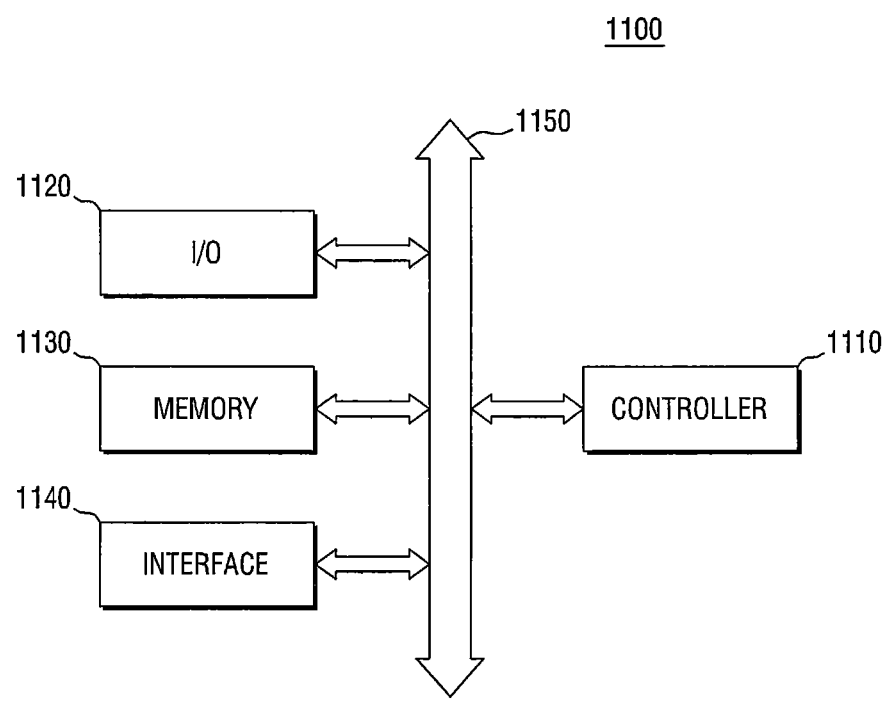
FIG. 35 is a block diagram of an electronic system 1100.

FIG. 35 is a block diagram of an electronic system 1100 including semiconductor devices (illustrated in FIGS. 25, 32 and 34) according to embodiments of the present inventive concept.

Referring to FIG. 35, the electronic system 1100 according to an embodiment of the present inventive concept may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver. Although not shown in the drawing, the electronic system 1100 may further include a high-speed dynamic random access memory (DRAM) and/or SRAM as an operating memory for improving the operation of the controller 1110. Semiconductor devices according to embodiments of the present inventive concept may be provided in the memory device 1130 or in the controller 1110 or the I/O device 1120.

The electronic system 1100 can be applied to a personal digital assistant (PDA), a portable computer, a web tablet, a wireless phone, a mobile phone, a digital music player, a memory card, and all electronic products capable of transmitting and/or receiving information in a wireless environment.

Figure 36:
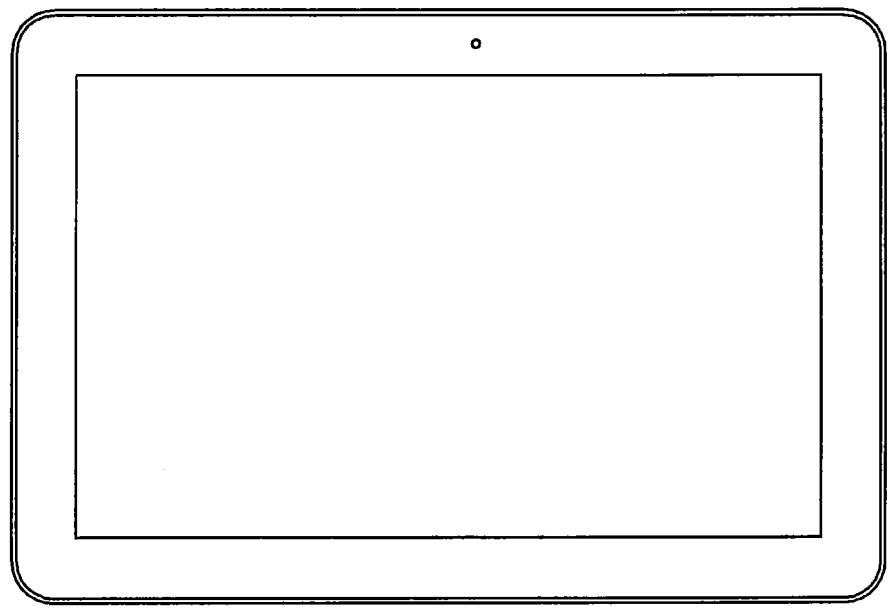
FIGS. 36 and 37 are diagrams illustrating an example of a semiconductor system to which semiconductor devices according to some embodiments of the present inventive concept can be applied.
Figure 37:
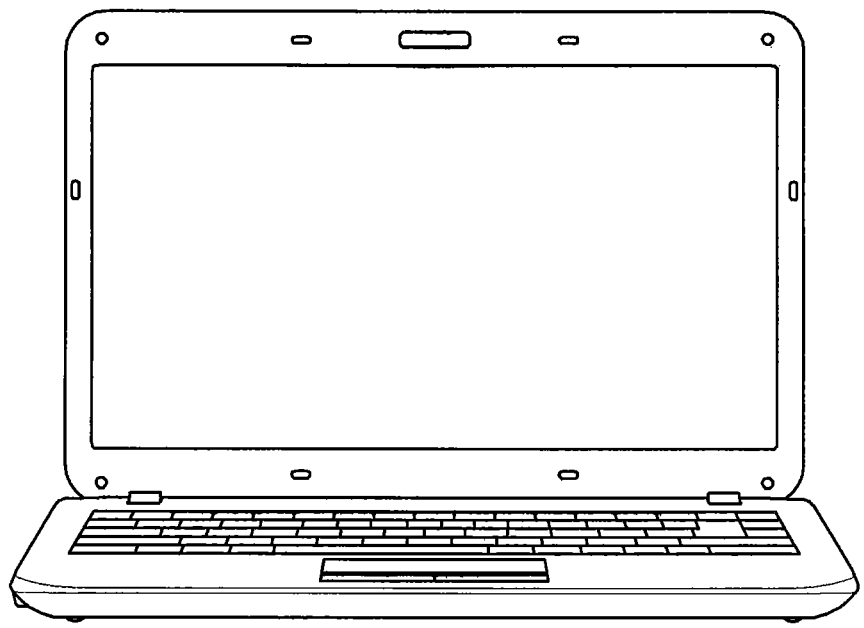

FIGS. 36 and 37 are diagrams illustrating an example of a semiconductor system to which semiconductor devices according to embodiments of the present inventive concept can be applied. More specifically, FIG. 36 illustrates a tablet personal computer (PC), and FIG. 37 illustrates a laptop computer. At least one of the semiconductor devices (illustrated in FIGS. 25, 32 and 34) according to embodiments of the present inventive concept, as set forth herein, may be used in a tablet PC or a laptop computer. The semiconductor devices according to embodiments of the present inventive concept, as set forth herein, can also be applied to various integrated circuit (IC) devices other than those set forth herein.

Although preferred embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A method of fabricating a semiconductor device, comprising:
    forming first and second fins that protrude from a substrate and extend in a first direction and form a trench that separates the first and second fins in the first direction;
    forming a field insulating layer on the substrate that fills the trench and covers the first and second fins;
    etching the field insulating layer until top surfaces of the first and second fins are exposed;
    forming an etch-stop layer pattern on the field insulating layer that fills the trench; and
    partially exposing sidewalls of the first and second fins by etching the field insulating layer using the etch-stop layer pattern as a mask.

2. The method of claim 1, wherein a width of an upper portion of the trench in the first direction is smaller than a width of the etch-stop layer pattern in the first direction.

3. The method of claim 1, wherein the first and second fins are partially etched while the field insulating layer is etched.

4. The method of claim 3, wherein the top surfaces of the first and second fins are lower than a bottom surface of the etch-stop layer pattern.

5. The method of claim 1, further comprising, after the etching of the field insulating layer:
    forming a first gate to intersect the first fin and forming a second gate on the etch-stop layer pattern; and
    forming a recess in the first fin between the first and second gates,
    wherein the field insulating layer within the trench is not exposed.

6. The method of claim 1, wherein the etch-stop layer pattern and the field insulating layer each comprise an oxide layer.

7. The method of claim 1, wherein the etch-stop layer pattern comprises a nitride layer.

8. A method of fabricating a semiconductor device, comprising:
    forming a field insulating layer on a substrate, wherein the field insulating layer covers first and second fins that protrude from the substrate and fills a trench between the first and second fins;
    etching the field insulating layer, wherein top surfaces of the first and second fins are exposed;
    forming an etch-stop layer on the field insulating layer that fills the trench, wherein edges of the etch-stop layer extend past sidewalls of the trench; and
    etching the field insulating layer using the etch-stop layer as a mask.

9. The method of claim 8, wherein the first and second fins extend in a first direction, and wherein a width of the trench contacting the etch-stop layer in a first direction is smaller than a width of the etch-stop layer in the first direction, and wherein etching the field insulating layer using the etch-stop as a mask comprises etching the field insulating layer to expose sidewalls of the first and second fins facing a second direction.

10. The method of claim 8, further comprising:
    forming a first gate to intersect the first fin;
    forming a dummy gate on the etch-stop layer; and
    forming a recess in the first fin between the first and dummy gates using the etch-stop layer as a mask, wherein the field insulating layer within the trench is not exposed.

11. The method of claim 10, further comprising forming a spacer on the etch-stop layer disposed on a sidewall of the dummy gate prior to forming the recess, and wherein forming the recess in the first fin comprises forming the recess such that the spacer overlaps a sidewall of the recess facing the trench.

12. The method of claim 8, further comprising:
    forming a first gate to intersect the first fin;
    removing the etch-stop layer;

forming a dummy gate on the field insulating layer previously covered by the etch-stop layer;
forming a gate mask layer on the dummy gate;
forming a spacer disposed on a sidewall of the dummy gate; and
forming a recess in the first fin between the first and dummy gates using the gate mask layer and the spacer as a mask, wherein the field insulating layer within the trench is not exposed.

* * * * *